(12) United States Patent
Kwon et al.

(10) Patent No.: US 12,009,442 B2
(45) Date of Patent: Jun. 11, 2024

(54) LIGHT DETECTOR, LIGHT DETECTION SYSTEM, LIDAR DEVICE, AND MOVING BODY

(71) Applicant: KABUSHIKI KAISHA TOSHIBA, Tokyo (JP)

(72) Inventors: Honam Kwon, Kawasaki Kanagawa (JP); Mariko Shimizu, Setagaya Tokyo (JP); Kazuaki Okamoto, Yokohama Kanagawa (JP); Kazuhiro Suzuki, Meguro Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 464 days.

(21) Appl. No.: 17/446,591

(22) Filed: Aug. 31, 2021

(65) Prior Publication Data
US 2022/0223749 A1    Jul. 14, 2022

(30) Foreign Application Priority Data
Jan. 14, 2021  (JP) ................................. 2021-004297

(51) Int. Cl.
*H01L 31/00* (2006.01)
*G01S 7/481* (2006.01)
(Continued)

(52) U.S. Cl.
CPC ...... *H01L 31/02327* (2013.01); *G01S 7/4816* (2013.01); *G01S 7/4863* (2013.01); *H01L 31/107* (2013.01); *G01S 17/931* (2020.01)

(58) Field of Classification Search
CPC ................. H01L 31/107; H01L 31/109; H01L 31/02327; H01L 27/14636;
(Continued)

(56) References Cited

U.S. PATENT DOCUMENTS

2007/0114362 A1    5/2007   Feng et al.
2008/0038001 A1    2/2008   Becker et al.
(Continued)

FOREIGN PATENT DOCUMENTS

JP    2009-517662 A    4/2009
JP    2009-526489 A    7/2009
(Continued)

*Primary Examiner* — Kevin K Pyo
(74) *Attorney, Agent, or Firm* — Finnegan, Henderson, Farabow, Garrett & Dunner, LLP

(57) ABSTRACT

According to one embodiment, a light detector includes a junction region, a first insulating portion, and a quenching part. The junction region includes a first semiconductor region of a first conductivity type and a second semiconductor region of a second conductivity type. The second semiconductor region is provided on the first semiconductor region and forms a p-n junction surface with the first semiconductor region. The first insulating portion has an inclined surface inclined with respect to a first direction perpendicular to the p-n junction surface and includes void. The inclined surface is provided at a same height as at least a portion of the junction region and crosses the second direction from the junction region toward the first insulating portion. The quenching part is electrically connected to the second semiconductor region.

20 Claims, 34 Drawing Sheets

(51) Int. Cl.
*G01S 7/4863* (2020.01)
*H01L 31/0232* (2014.01)
*H01L 31/107* (2006.01)
*G01S 17/931* (2020.01)

(58) Field of Classification Search
CPC .............. H01L 27/14654; G01S 7/4816; G01S 7/4863; G01S 17/931
See application file for complete search history.

(56) References Cited

U.S. PATENT DOCUMENTS

| | | | |
|---|---|---|---|
| 2009/0121306 A1* | 5/2009 | Ishikawa | H01L 27/1463 257/E31.093 |
| 2009/0256223 A1 | 10/2009 | Yamamura et al. | |
| 2011/0095388 A1 | 4/2011 | Richter et al. | |
| 2014/0291487 A1 | 10/2014 | Laforce | |
| 2015/0140577 A1 | 5/2015 | Li et al. | |
| 2017/0315122 A1 | 11/2017 | Li et al. | |
| 2017/0330982 A1 | 11/2017 | Yonehara et al. | |
| 2018/0372872 A1 | 12/2018 | Kwon et al. | |
| 2019/0165198 A1 | 5/2019 | Kwon et al. | |
| 2020/0025934 A1 | 1/2020 | Kwon et al. | |
| 2021/0132230 A1 | 5/2021 | Fujiwara et al. | |
| 2022/0059710 A1 | 2/2022 | Kwon et al. | |
| 2022/0352219 A1* | 11/2022 | Shimizu | H01L 27/14643 |

FOREIGN PATENT DOCUMENTS

| | | |
|---|---|---|
| JP | 2010-536165 A | 11/2010 |
| JP | 2011-258691 A | 12/2011 |
| JP | 2012-122950 A | 6/2012 |
| JP | 2014-192895 A | 10/2014 |
| JP | 5616552 B2 | 10/2014 |
| JP | 2017-204561 A | 11/2017 |
| JP | 2019-9436 A | 1/2019 |
| JP | 2019-527839 A | 10/2019 |
| JP | 2020-13950 A | 1/2020 |
| JP | 2021-72347 A | 5/2021 |
| JP | 2022-35262 A | 3/2022 |
| WO | WO 2018/014013 A1 | 1/2018 |

* cited by examiner

LIGHT DETECTOR, LIGHT DETECTION SYSTEM, LIDAR DEVICE, AND MOVING BODY

CROSS-REFERENCE TO RELATED APPLICATIONS

This application is based upon and claims the benefit of priority from Japanese Patent Application No. 2021-004297, filed on Jan. 14, 2021; the entire contents of which are incorporated herein by reference.

FIELD

Embodiments described herein relate generally to a light detector, a light detection system, a lidar device, and a moving body.

BACKGROUND

There is a light detector that detects light incident on a semiconductor region. For the light detector, it is desired that the crosstalk is small.

DETAILED DESCRIPTION

Figure 1:
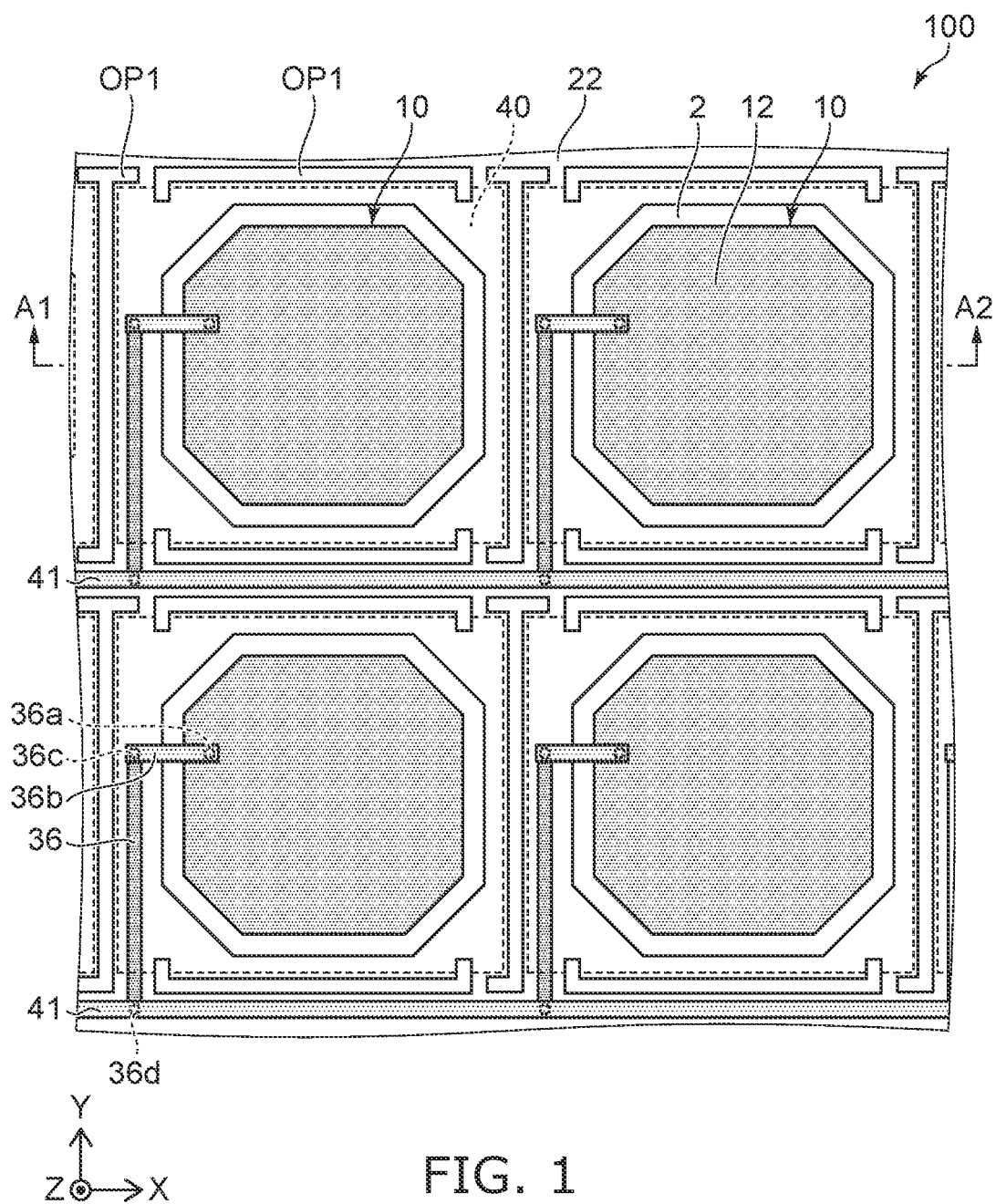
FIG. 1 is a plan view showing a light detector according to a first embodiment.

According to one embodiment, a light detector includes a junction region, a first insulating portion, and a quenching part. The junction region includes a first semiconductor region of a first conductivity type and a second semiconductor region of a second conductivity type. The second semiconductor region is provided on the first semiconductor region and forms a p-n junction surface with the first semiconductor region. The first insulating portion has an inclined surface inclined with respect to a first direction perpendicular to the p-n junction surface and includes void. The inclined surface is provided at a same height as at least a portion of the junction region and crosses the second direction from the junction region toward the first insulating portion. The quenching part is electrically connected to the second semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 2:
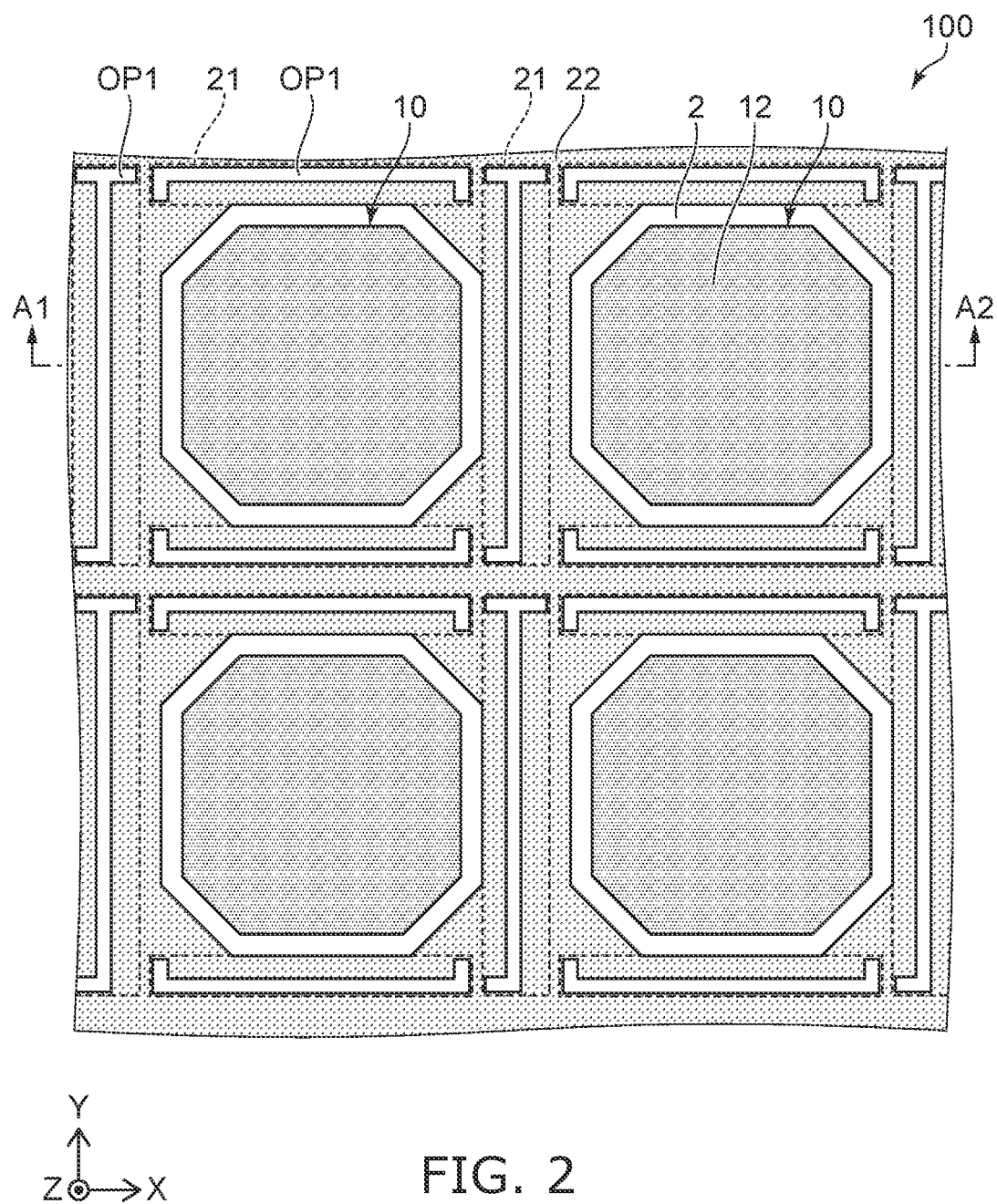
FIG. 2 is a plan view showing the light detector according to the first embodiment.
Figure 3:
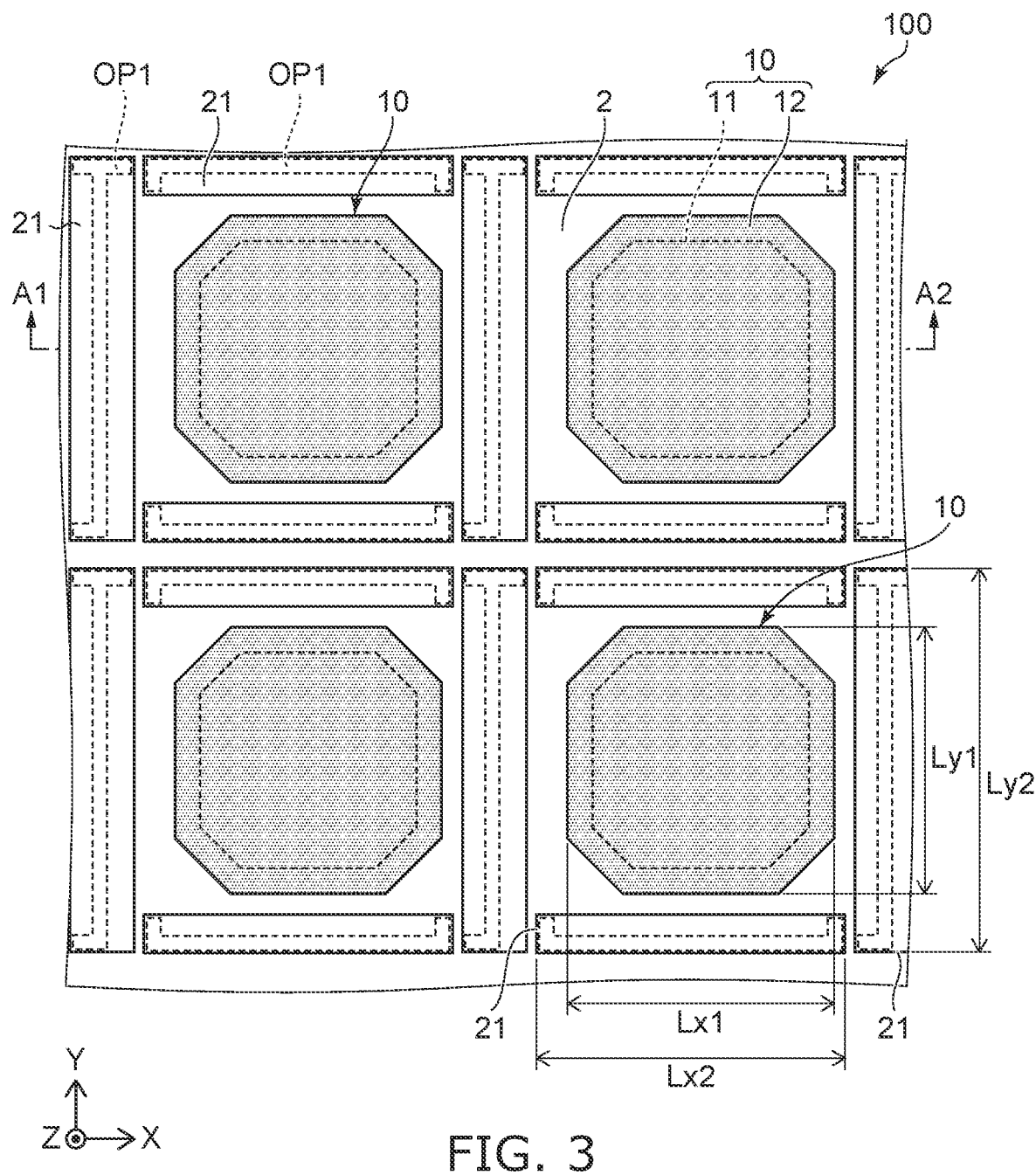
FIG. 3 is a plan view showing the light detector according to the first embodiment.

FIGS. 1 to 3 are plan views showing a light detector according to a first embodiment.

Figure 4:
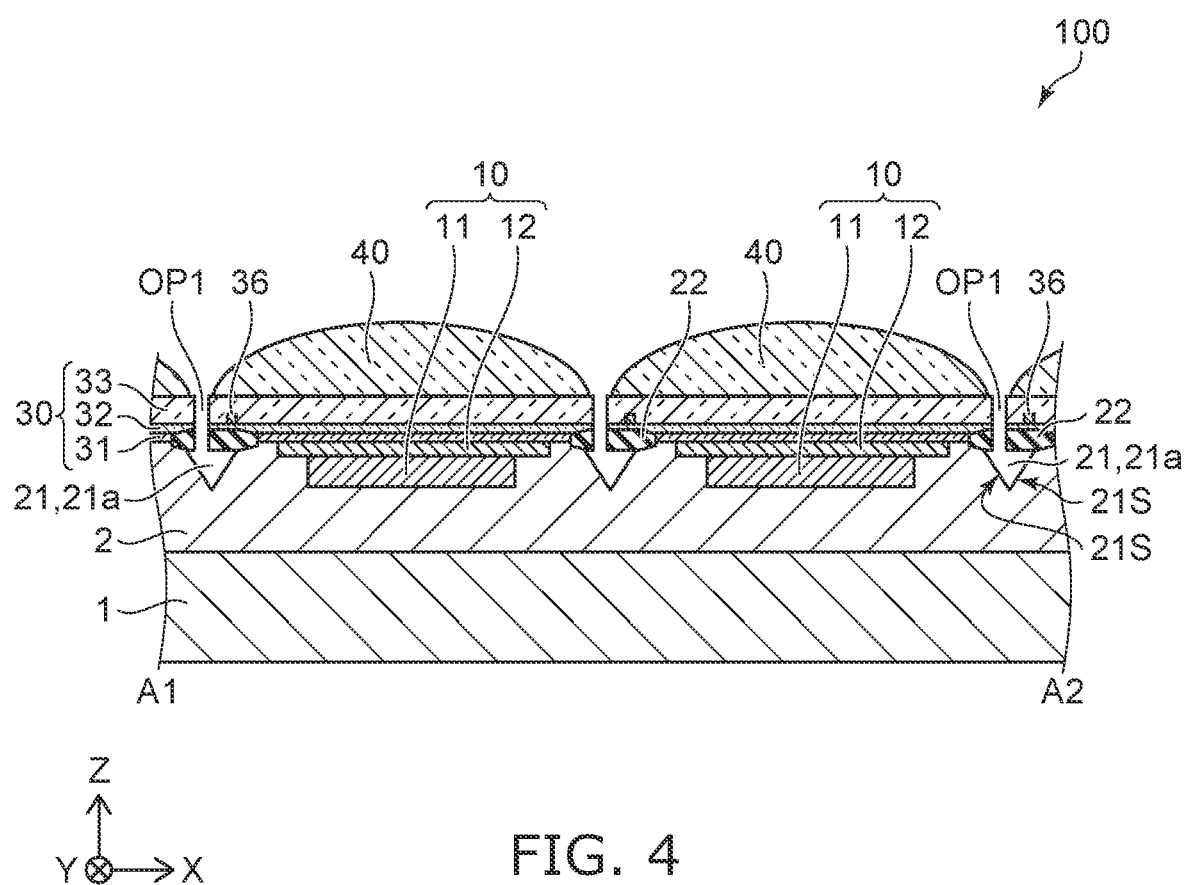
FIG. 4 is a cross-sectional view taken along the line A1-A2 of FIG. 1 to FIG. 3.

FIG. 4 is a cross-sectional view taken along the line A1-A2 of FIGS. 1 to 3.

As shown in FIGS. 1 to 4, a light detector 100 according to the first embodiment includes a semiconductor layer 1, a semiconductor layer 2, a junction region 10, a first insulating portion 21, a second insulating portion 22, an insulating layer 30, a quenching part 36, a lens 40, and a first interconnect 41.

It is noted that, in FIG. 1, the lens 40 is shown by a broken line, and the insulating layer 30 is omitted. In FIG. 2, the insulating layer 30, the quenching part 36, the lens 40, and the first interconnect 41 are omitted. In FIG. 3, the second insulating portion 22, the insulating layer 30, the quenching part 36, the lens 40, and the first interconnect 41 are omitted, and a first semiconductor region 11 and a first opening OP1 are shown by broken lines.

As shown in FIG. 4, the junction region 10 includes the first semiconductor region 11 and a second semiconductor region 12. Herein, the direction from the first semiconductor region 11 toward the second semiconductor region 12 is taken as a Z-direction (first direction). The two directions perpendicular to the Z-direction and orthogonal to each other are taken as an X-direction (second direction) and a Y-direction (third direction). For the description, the direction from the first semiconductor region 11 toward the second semiconductor region 12 is referred to as an "upward direction", and the opposite direction is referred to as a "downward direction". These directions are based on a relative positional relationship between the first semiconductor region 11 and the second semiconductor region 12 and are independent of the direction of gravity.

As shown in FIG. 4, the semiconductor layer 2 is provided on the semiconductor layer 1. The first semiconductor region 11 is provided on a portion of the semiconductor layer 2. The first semiconductor region 11 is electrically connected to the semiconductor layer 1 via the semiconductor layer 2. The second semiconductor region 12 is provided on the first semiconductor region 11. A p-n junction surface is formed between the first semiconductor region 11 and the second semiconductor region 12. For example, the p-n junction surface is parallel to the X-direction and Y-direction. The upper surface or the p-n junction surface of the first semiconductor region 11 is perpendicular to the Z-direction.

The semiconductor layer 1, the semiconductor layer 2, and the first semiconductor region 11 are of the first conductivity type. The second semiconductor region 12 is of a second conductivity type. The impurity concentration of the first conductivity type in the semiconductor layer 2 is lower than the impurity concentration of the first conductivity type in the semiconductor layer 1. The impurity concentration of the first conductivity type in the first semiconductor region 11 is higher than the impurity concentration of the first conductivity type in the semiconductor layer 2. The first conductivity type is one of the p-type and the n-type. The second conductivity type is the other of the p-type and the n-type.

The first insulating portion 21 is provided on another portion of the semiconductor layer 2. The first insulating portion 21 has an inclined surface 21S inclined with respect to the Z-direction. The inclined surface 21S faces the junction region 10 in the second direction. That is, the inclined surface 21S intersects the direction from the junction region 10 toward the first insulating portion 21 and faces the junction region 10. The inclined surface 21S is provided at the same height as at least a portion of the junction region 10. The position of the inclined surface 21S in the Z-direction is the same as the position of at least a portion of the junction region 10 in the Z-direction. For example, a portion of the inclined surface 21S is provided at the same height as the p-n junction surface between the first semiconductor region 11 and the second semiconductor region 12.

The first insulating portion 21 includes void 21a. In the light detector 100, the first insulating portion 21 is formed of only the void 21a. For example, the first insulating portion 21 has a pair of the inclined surfaces 21S facing each other. The void is located between the pair of inclined surfaces 21S. The inclined surface 21S is an interface between the semiconductor layer 2 and the void 21a.

In the portion where the inclined surface 21S is provided, the width of a portion of the first insulating portion 21 is smaller than the width of another portion of the first insulating portion 21 located above the portion of the first insulating portion 21. For example, the width of the lower portion of the first insulating portion 21 is smaller than the width of the upper portion of the first insulating portion 21. The distance between the upper portion of the inclined surface 21S and the center of the junction region 10 along the X-Y plane (first plane) is shorter than the distance between the lower portion of the inclined surface 21S and the center. The "width" is the length in the direction from the junction region 10 toward the first insulating portion 21. For example, when the direction from the junction region 10 toward the first insulating portion 21 is parallel to the X-direction, the "width" is the length in the X-direction.

The first semiconductor region 11 and the second semiconductor region 12 are separated from the first insulating portion 21. A portion of the semiconductor layer 2 is provided between the junction region 10 and the first insulating portion 21. The inclined surface 21S is a boundary surface between the semiconductor layer 2 and the first insulating portion 21.

The second insulating portion 22 is provided on the first insulating portion 21. The lower end of the second insulating portion 22 is provided at the same height as the second semiconductor region 12. The second insulating portion 22 includes an insulating material. For example, the width of the second insulating portion 22 is larger than the width of the first insulating portion 21.

The insulating layer 30 is a light transmissive layer and is provided on the junction region 10, the first insulating portion 21, and the second insulating portion 22. The quenching part 36 is provided in the insulating layer 30 and is located on the second insulating portion 22.

As shown in FIG. 1, one end of the quenching part 36 is electrically connected to the second semiconductor region 12 via a contact plug 36a, an interconnect 36b, and a contact plug 36c. The other end of the quenching part 36 is electrically connected to the first interconnect 41 provided in the insulating layer 30 via a contact plug 36d. The electrical resistance of the quenching part 36 is larger than the electrical resistance of each of the contact plug 36a, the interconnect 36b, the contact plug 36c, and the contact plug 36d. It is favorable that the electrical resistance of the quenching part 36 is not less than 50 kΩ and not more than 20 MΩ.

The lens 40 is provided on the insulating layer 30 and is located on the junction region 10. The upper surface of the lens 40 is convex upward. The lens 40 collects the light toward the junction region 10. The shape of the lens 40 is generally a quadrangle, a quadrangle with rounded corners, or a circle when viewed from the Z-direction.

As shown in FIG. 3, the multiple first insulating portions 21 are provided around one junction region 10 along the X-Y plane. The multiple first insulating portions 21 are separated from each other. As shown in FIG. 2, the one common second insulating portion 22 is provided on the multiple first insulating portions 21.

As shown in FIGS. 1 to 3, the multiple junction regions 10 are provided in the X-direction and the Y-direction. The multiple junction regions 10 aligned in the X-direction are electrically connected to one first interconnect 41 via the multiple quenching parts 36, respectively. One or more first insulating portions 21 are provided between the adjacent junction regions 10. In the example shown in FIG. 3, one first insulating portion 21 is alternately aligned with one junction region 10 in the X-direction. In the Y-direction, the two first insulating portions 21 are alternately aligned with the one junction region 10.

As shown in FIG. 2, the multiple first openings OP1 are provided to the second insulating portion 22 and the insulating layer 30. The multiple first openings OP1 are separated from each other. One first opening OP1 is connected to one void 21a, As shown in FIG. 1, when viewed from the Z-direction, the shape of the first opening OP1 is an I shape or a J shape. When viewed from the Z-direction, the position of the first opening OP1 is different from the position of the junction region 10, the position of the quenching part 36, and the position of the first interconnect 41. When viewed from the Z-direction, at least a portion of the position of the first opening OP1 may be the same as a portion of the position of the lens 40. Alternatively, the position of the first opening OP1 may be different from the position of the lens 40.

The operations of the light detector 100 will be described.

When the light is incident on the junction region 10 from the above, electric charges are generated in the semiconductor layer 2 or the junction region 10. When the electric charges are generated, a current flows through the quenching part 36 and the first interconnect 41. The incidence of the light on the junction region 10 can be detected by detecting the current flowing through the first interconnect 41.

For example, a reverse voltage is applied between the first semiconductor region 11 and the second semiconductor region 12. The junction region 10 functions as an avalanche photodiode. A reverse voltage exceeding a breakdown voltage may be applied between the first semiconductor region 11 and the second semiconductor region 12. That is, the junction region 10 may operate in a Geiger mode. Due to the operation in the Geiger mode, a pulsed signal with a high gain and a short time constant is output. Accordingly, the light reception sensitivity of the light detector 100 can be improved.

When the light is incident on the junction region 10 and avalanche breakdown occurs, the quenching part 36 is provided to suppress the continuation of the avalanche breakdown. When the avalanche breakdown occurs and a current flows through the quenching part 36, a voltage drop occurs according to the electrical resistance of the quenching part 36. Due to the voltage drop, the potential difference between the first semiconductor region 11 and the second semiconductor region 12 is decreased, and thus, the avalanche breakdown is stopped. Accordingly, next, the light incident on the junction region 10 can be detected.

As described above, a resistor that causes a large voltage drop may be provided as the quenching part 36, or a control circuit that cuts off the current instead of the resistor may be provided as the quenching part 36. For example, the control circuit includes a comparator, a control logic unit, and two switching junction regions. A known configuration called an active quenching circuit can be applied to the control circuit.

An example of the material of each element will be described.

The semiconductor layer 1, the semiconductor layer 2, the first semiconductor region 11, and the second semiconductor region 12 include silicon. For example, the semiconductor layer 1, the semiconductor layer 2, the first semiconductor region 11, and the second semiconductor region 12 include silicon. Phosphorus, arsenic, or antimony is used as an n-type impurity. Boron is used as a p-type impurity. A (100) plane of a silicon single crystal included in the semiconductor layers 1 and 2 is perpendicular to the Z-direction.

The second insulating portion 22 and the insulating layer 30 include one selected from a group consisting of silicon, oxygen, and nitrogen. As shown in FIG. 4, the insulating layer 30 may include a first layer 31 to a third layer 33. The second layer 32 is provided on the first layer 31. The third layer 33 is provided on the second layer 32. For example, the second insulating portion 22, the first layer 31, and the third layer 33 include silicon oxide. The second layer 32 includes silicon nitride.

The quenching part 36 as a resistor includes polysilicon. n-type impurities or p-type impurities may be added to the quenching part 36. The contact plug and each interconnect include at least one metal selected from a group consisting of titanium, tungsten, copper, and aluminum.

The lens 40 includes a light-transmissive resin. It is favorable that the resin is an acrylic resin. The acrylic resin may be a resin mixed with propylene glycol monomethyl ether acetate.

For example, the first conductivity type is a p-type and the second conductivity type is an n-type, Boron, which is a p-type impurity, is easy to be implanted into silicon and to be diffused in silicon in comparison with n-type impurities. For this reason, when the first conductivity type is the p-type, the first semiconductor region 11 is easily formed. The sensitivity of the light detector 100 can be improved.

The first conductivity type may be an n-type, and the second conductivity type may be a p-type. In this case, a positive voltage is applied to the semiconductor layer 1 with respect to the second semiconductor region 12. The electrons generated in the shallow portion of the semiconductor layer 2 can move toward the semiconductor layer 1 faster than the holes, and thus, avalanche doubling can be promoted. The electrons toward the semiconductor layer 1 are allowed to move faster, so that the time of long tail noise can be shortened. The long tail noise is a minute signal generated after the light is incident on the junction region 10 and a pulsed signal appears.

FIGS. 5A to 9B are schematic views showing a method for manufacturing a light detector according to the first embodiment.

FIGS. 5B, 6B, 7B, 8B, and 9B show B1-B2 cross sections of FIGS. 5A, 6A, 7A, 8A, and 9A, respectively. In FIGS. 5A, 6A, 7A, 8A, and 9A, the insulating layer 30 is omitted.

Figure 5A:
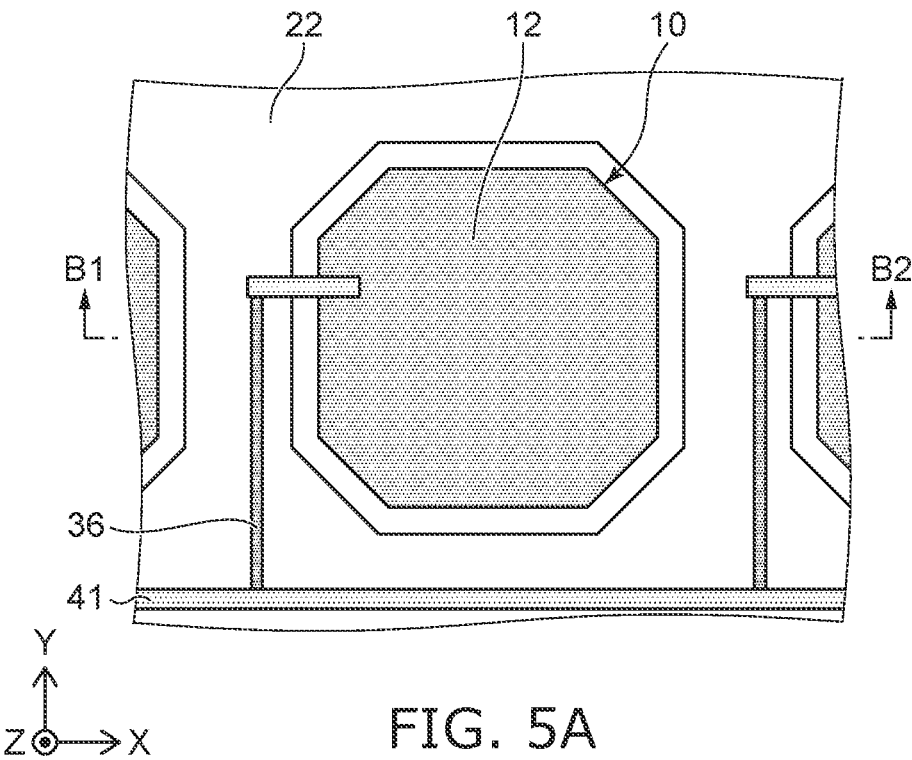
FIGS. 5A and 5B are schematic views showing a method for manufacturing the light detector according to the first embodiment.
Figure 5B:
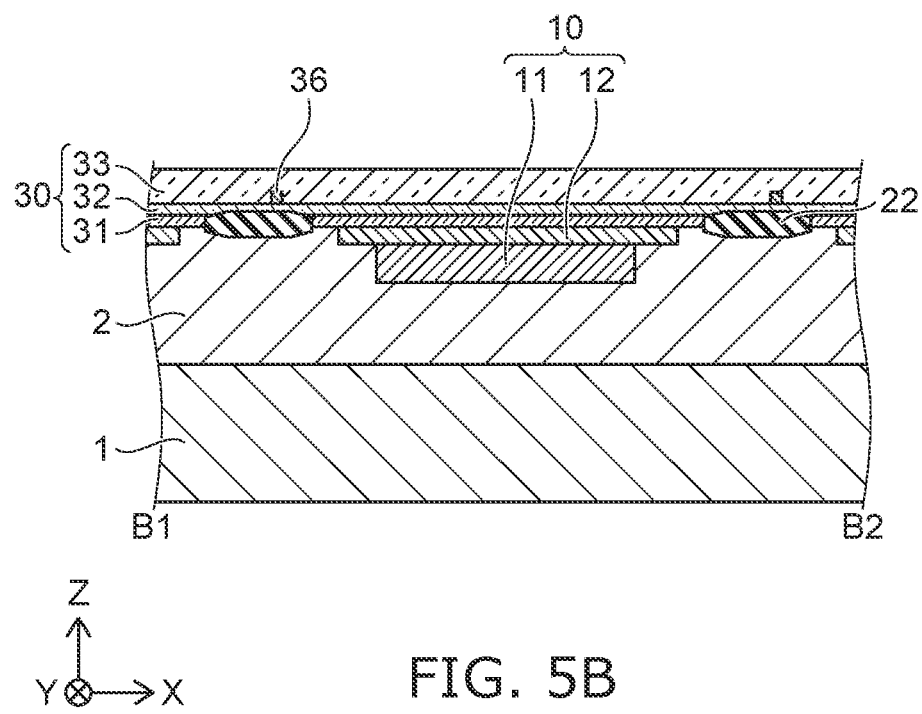

As shown in FIGS. 5A and 5B, the semiconductor layer 2, the junction region 10, the second insulating portion 22, the insulating layer 30, and the quenching part 36 are formed on the semiconductor layer 1 which is a semiconductor substrate by a known method. For example, the semiconductor layer 2 is formed by epitaxial growth of the semiconductor layer 1 on the (100) plane. The first semiconductor region 11 and the second semiconductor region 12 are formed by ion implantation into the semiconductor layer 2. The second insulating portion 22 is formed of local oxidation of silicon (LOCOS). The insulating layer 30 and the quenching part 36 are formed by chemical vapor deposition (CVD).

Figure 6A:
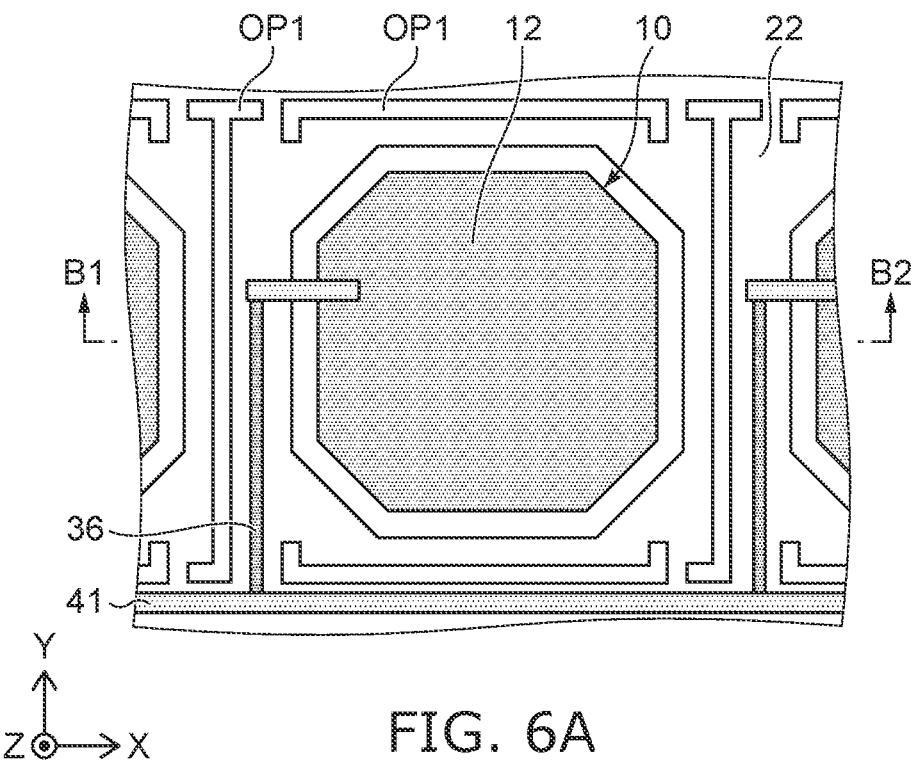
FIGS. 6A and 6B are schematic views showing a method for manufacturing the light detector according to the first embodiment.
Figure 6B:
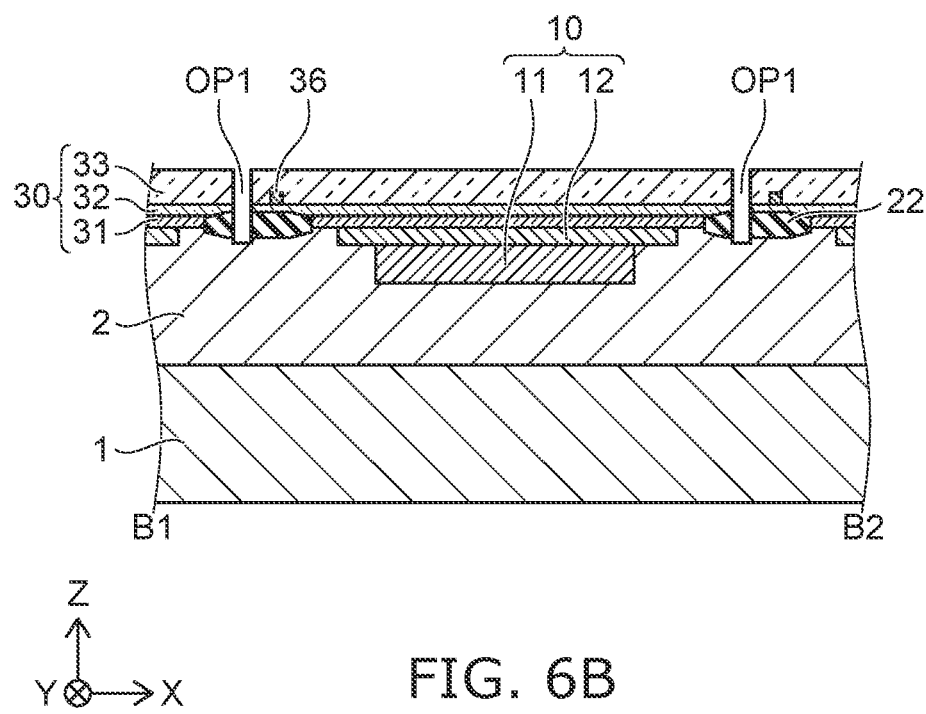

As shown in FIGS. 6A and 6B, the multiple first openings OP1 penetrating the second insulating portion 22 and the insulating layer 30 are formed by photolithography and reactive ion etching (RIE). The multiple first openings OP1 are formed so as to avoid the junction region 10, the quenching part 36, and the first interconnect 41. The semiconductor layer 2 is exposed at the bottom of the first opening OP1.

Figure 7A:
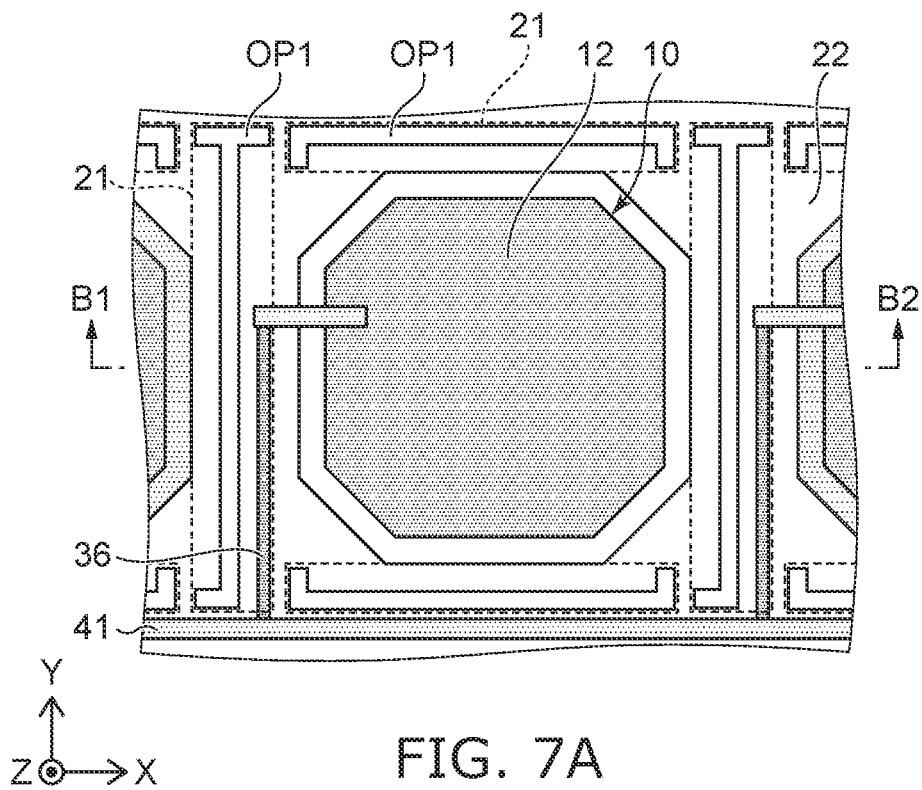
FIGS. 7A and 7B are schematic views showing a method for manufacturing the light detector according to the first embodiment.
Figure 7B:
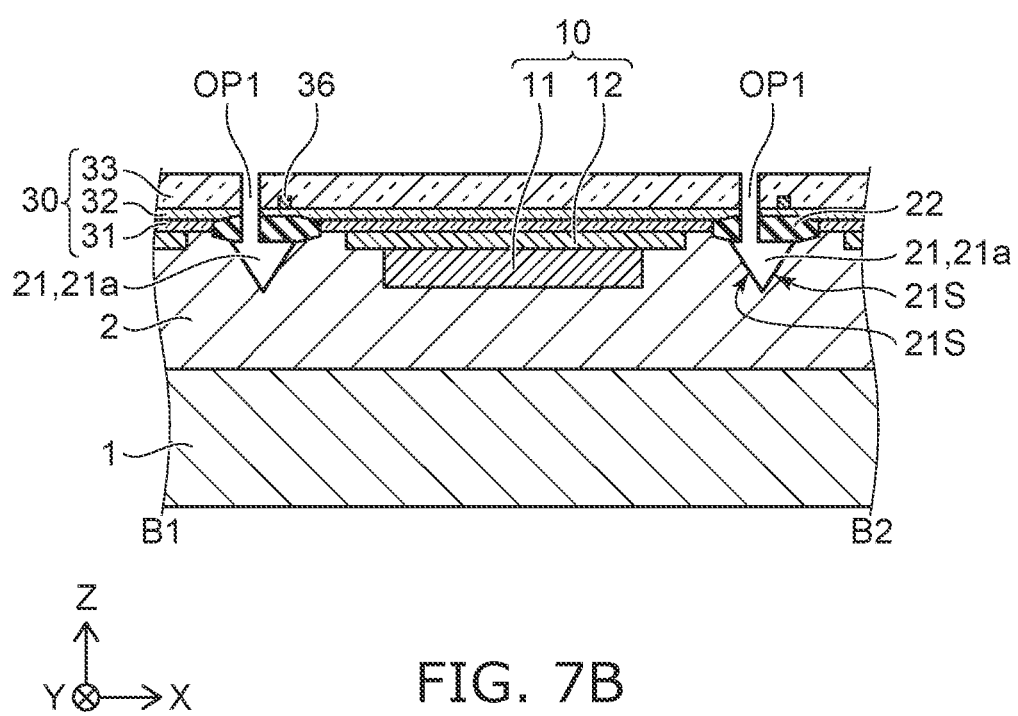

As shown in FIGS. 7A and 7B, a portion of the semiconductor layer 2 is removed through the first opening OP1 by wet etching. Potassium hydroxide (KOH) or tetramethylammonium hydroxide (TMAH) is used as a chemical liquid. The first insulating portion 21 including the void 21a is formed by wet etching. As shown in FIG. 7A, when viewed from the Z-direction, the shape of the first insulating portion 21 is a quadrangle circumscribing one first opening OP1. As shown in FIG. 7B, a silicon (111) plane inclined with respect to the Z-direction appears on the side surface of the first insulating portion 21. Accordingly, the first insulating portion 21 having the inclined surface 21S is formed. For example, the inclination of the (111) plane with respect to the X-direction is 54 degrees to 55 degrees.

Figure 8A:
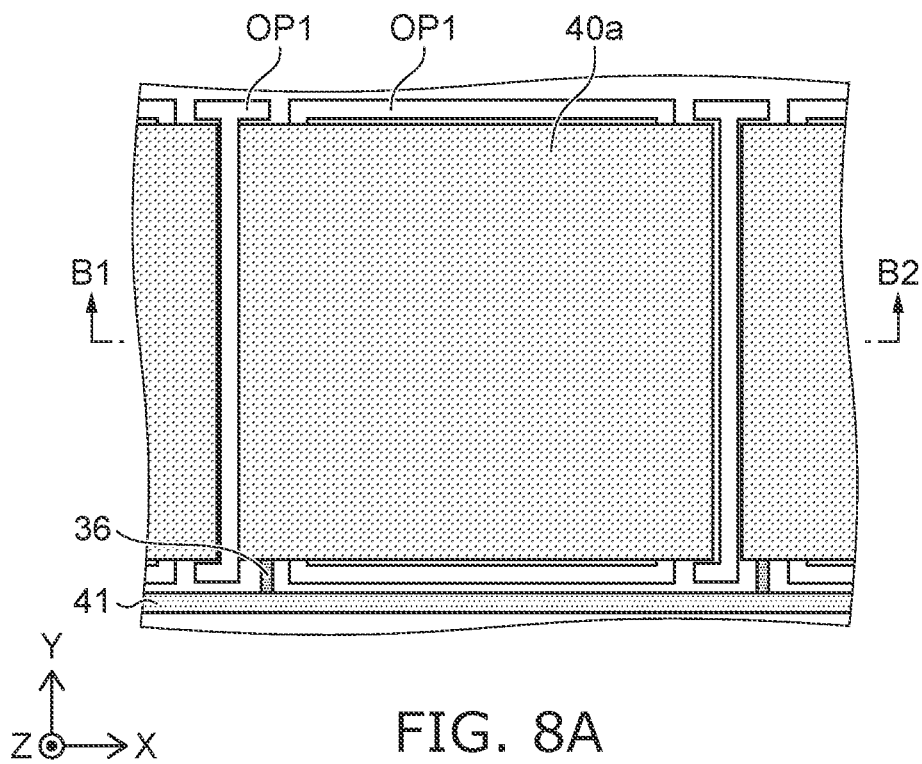
FIGS. 8A and 8B are schematic views showing a method for manufacturing the light detector according to the first embodiment.
Figure 8B:
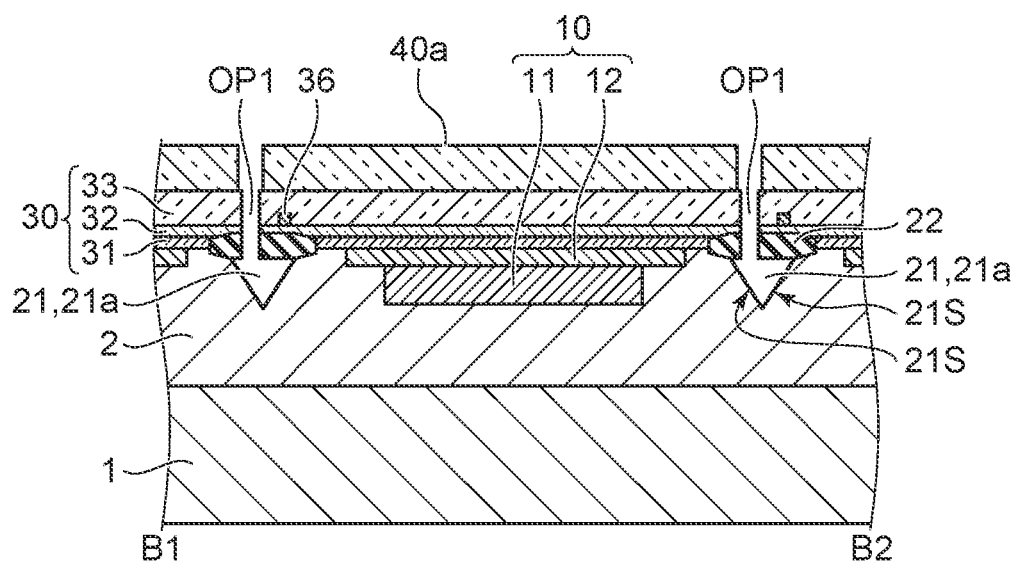

A resin layer 40a is formed by applying a resin on the insulating layer 30. As shown in FIGS. 8A and 8B, a portion of the resin layer 40a located on the first opening OP1 is removed by photolithography and RIE. Accordingly, the resin layer 40a is separated into multiple pieces. As a result, it is possible to prevent the resin from flowing into the first opening OP1 and the void 21a in the subsequent reflow process.

Figure 9A:
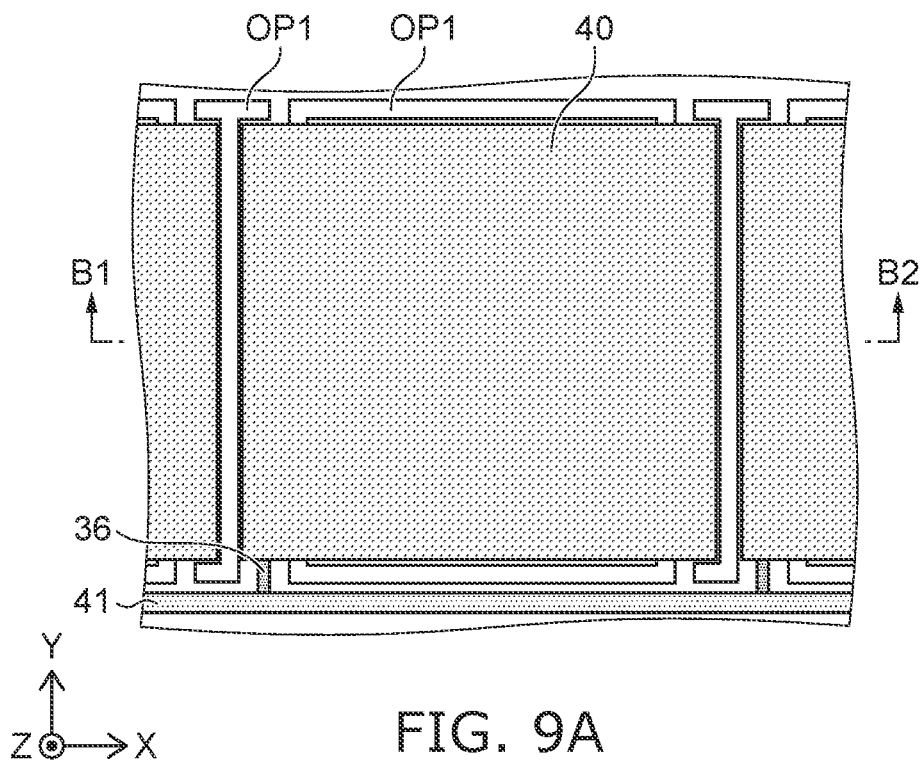
FIGS. 9A and 9B are schematic views showing a method for manufacturing the light detector according to the first embodiment.
Figure 9B:
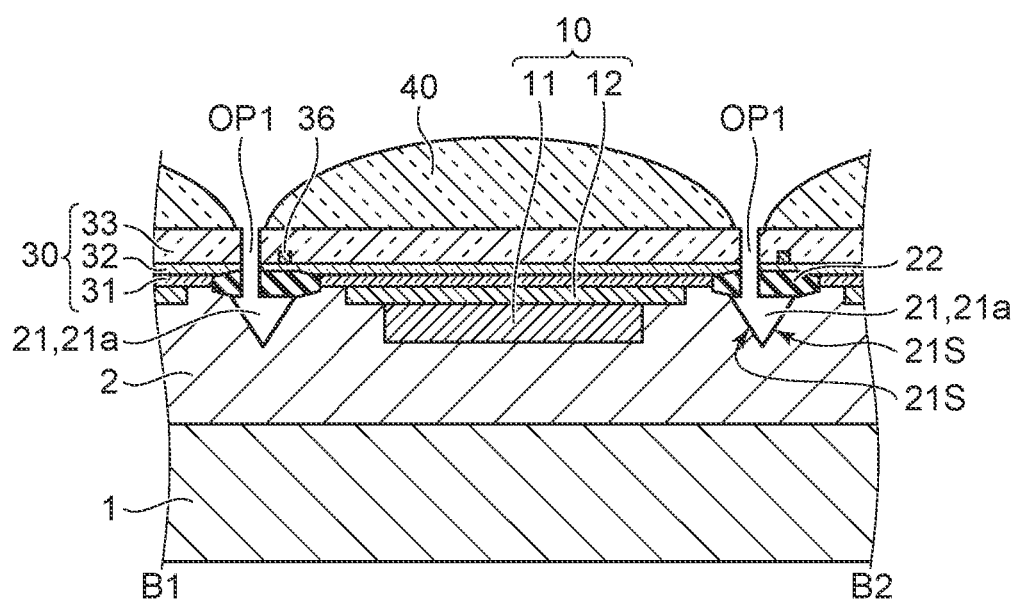

Due to the heat treatment, the fluidity of the resin layer 40a is increased, so that the resin layer 40a is allowed to reflow. As shown in FIGS. 9A and 9B, the upper surface of the resin layer 40a is curved by surface tension. The resin layer 40a is solidified to form the lens 40. Through the above-described processes, the light detector 100 according to the first embodiment is manufactured.

In the manufacturing method described above, the formation of the first opening OP1 and the formation of the first insulating portion 21 may be performed after the formation of the resin layer 40a. For example, the resin layer 40a at the position where the first opening OP1 is formed is removed by photolithography and RIE. The multiple first openings OP1 penetrating the second insulating portion 22 and the insulating layer 30 through the openings formed in the resin layer 40a are formed. A portion of the semiconductor layer 2 is removed through the first opening OP1 by wet etching, and thus, the first insulating portion 21 is formed.

The advantages of the first embodiment will be described.

When the light is incident on the junction region 10, electric charges are generated. A portion of the electric charges recombine and emit light (secondary photons). When the secondary photons are incident on another junction region 10, electric charges are generated in the other junction region 10. That is, the crosstalk occurs. In order to improve the detection accuracy of photons by the light detector 100, it is desirable that the crosstalk can be suppressed.

Figure 10:
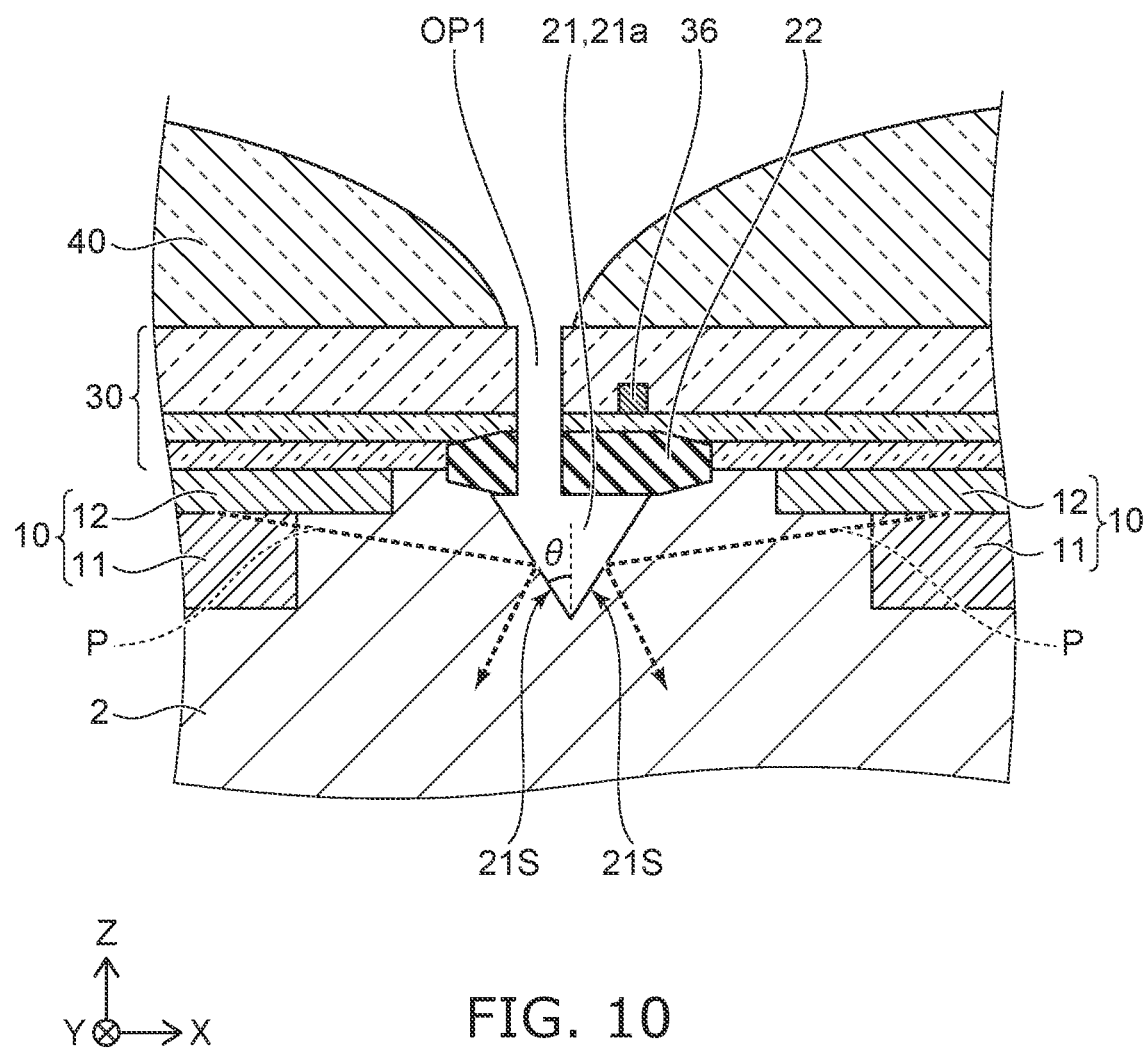
FIG. 10 is an enlarged cross-sectional view of a portion of FIG. 4.

FIG. 10 is an enlarged cross-sectional view of a portion of FIG. 4.

The light detector 100 according to the first embodiment includes the first insulating portion 21. The first insulating portion 21 has the inclined surface 21S. As the secondary photons P travel toward the adjacent junction region 10, the secondary photons P generated in the junction region 10 are reflected downward by the inclined surface 21S. Accordingly, the crosstalk can be suppressed.

The first insulating portion 21 includes the void 21a. The void 21a includes a gas, and the refractive index of the void 21a is lower than that of the semiconductor layer 2. The void 21a is provided, so that the difference between the refractive index of the first insulating portion 21 and the refractive index of the semiconductor layer 2 is increased in comparison with the case where the void 21a is not provided. As the difference is increased, the secondary photons P are more likely to be reflected by the inclined surface 21S. According to the first embodiment, the crosstalk can be effectively suppressed, and the accuracy of photon detection by the light detector 100 can be improved.

The void 21a is provided, so that the stress generated in the light detector 100 can be relaxed in the void 21a. For this reason, when the light detector 100 is manufactured, it is possible to reduce the occurrence of damage due to stress, the warpage of the semiconductor layers 1 and 2, and the like, and it is possible to improve the yield of the light detector 100.

As shown in FIG. 10, the secondary photons P are mainly generated in the vicinity of the p-n junction surface between the first semiconductor region 11 and the second semiconductor region 12. For this reason, it is favorable that a portion of the inclined surface 21S is provided at the same height as the p-n junction surface between the first semiconductor region 11 and the second semiconductor region 12. That is, it is favorable that the position of the portion of the inclined surface 21S in the Z-direction is the same as the position of the p-n junction surface in the Z-direction.

It is favorable that the inclination θ of the inclined surface 21S with respect to the Z-direction is larger than 17 degrees. According to Snell's law, the critical angle $\theta_m$ at which the secondary photons P are totally reflected, the refractive index n of the semiconductor layer 2, and the refractive index $n_o$ of the first insulating portion 21 satisfy the relationship of $\sin \theta_m = n_i/n_o$. When the semiconductor layer 2 includes silicon, the refractive index $n_i$ is 3.6. When the first insulating portion 21 is formed of the void 21a, the refractive index $n_o$ is 1. The critical angle $\theta_m$ based on the refractive indexes is about 16 degrees. When the inclination θ is larger than 17 degrees, more secondary photons P can be reflected. For example, the secondary photons P that travel from the p-n junction surface along the X-Y plane are totally reflected by the inclined surface 21S. Accordingly, the crosstalk can be effectively suppressed.

More favorably, the inclination θ is larger than 25 degrees. When forming the lens 40, there is a possibility that the reflowed resin may flow into the void 21a. In this case, a portion of the inclined surface 21S serves as an interface between the semiconductor layer 2 and the resin. For example, the refractive index $n_o$ of the first insulating portion 21 (resin) is 1.5. When the refractive index $n_i$ is 3.6 and the refractive index $n_o$ is 1.5, the critical angle $\theta_m$ is about 24 degrees. When the inclination θ is larger than 25 degrees, more secondary photons P can be reflected more reliably.

On the other hand, as the inclination θ becomes larger, the width of the upper portion of the first insulating portion 21 is increased. When the size of the light detector 100 is constant, as the width is increased, the area of the junction region 10 along the X-Y plane is decreased, so that the light reception sensitivity of the light detector 100 is lowered. Alternatively, when the area of the junction region 10 is constant, as the width is increased, the size of the light detector 100 is increased. From the viewpoint of the light reception sensitivity or the size of the light detector 100, it is favorable that the inclination θ is smaller than 45 degrees.

In order to effectively reduce the crosstalk, it is favorable that the length of the first insulating portion 21 (inclined surface 21S) in one direction is longer than the length of the junction region 10 in one direction. For example, as shown in FIG. 3, one first insulating portion 21 is aligned with one junction region 10 in the X-direction. A length Ly2 of the one first insulating portion 21 in the Y-direction is longer than a length Ly1 of the one junction region 10 in the Y-direction. Another first insulating portion 21 is aligned with the one junction region 10 in the Y-direction. A length Lx2 of the other first insulating portion 21 in the X-direction is longer than a length Lx1 of the one junction region 10 in the X-direction.

The first opening OP1 is provided, so that the stress generated in the light detector 100 can be relieved by the first opening OP1. For this reason, when the light detector 100 is manufactured, it is possible to reduce the occurrence of damage due to stress, the warpage of the semiconductor layers 1 and 2, and the like, and thus, it is possible to improve the yield of the light detector 100.

[First Variation]

Figure 11:
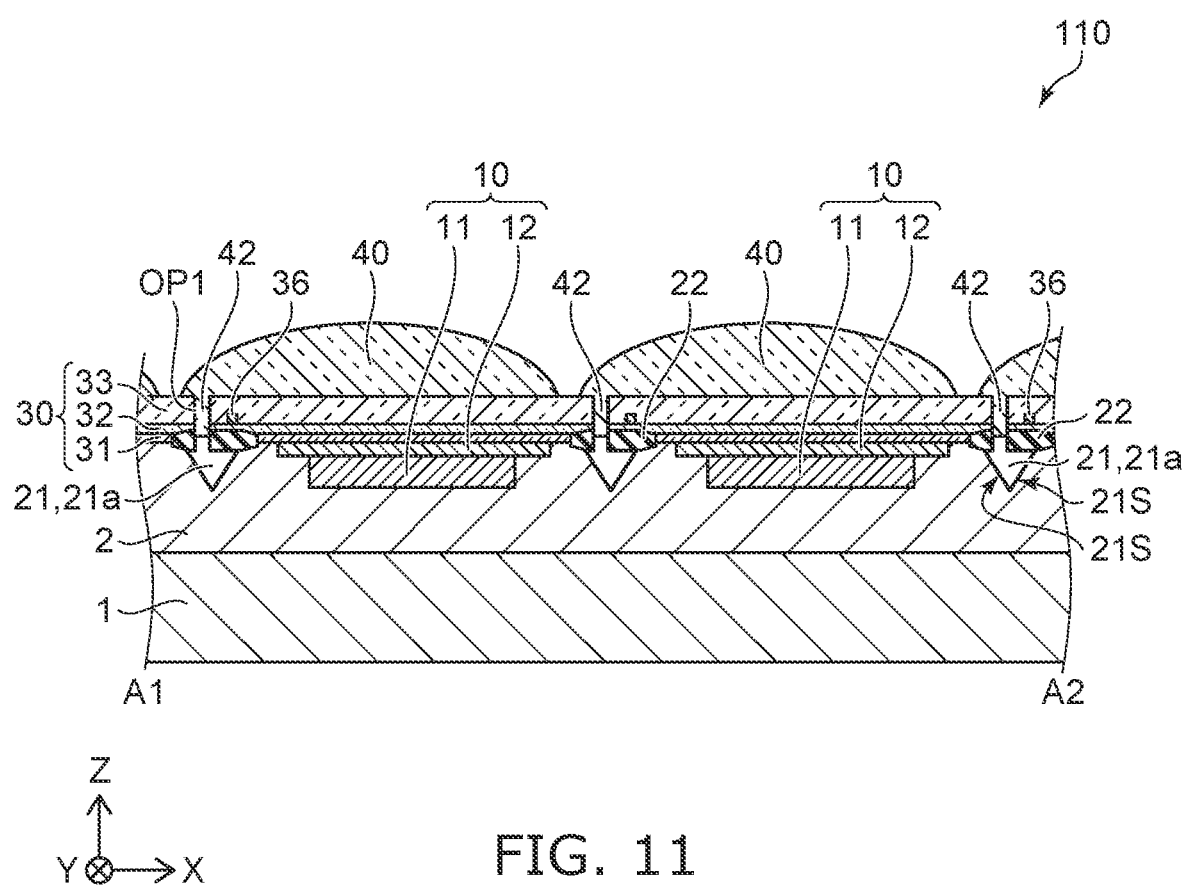
FIG. 11 is a cross-sectional view showing a light detector according to a first variation of the first embodiment.

FIG. 11 is a cross-sectional view showing a light detector according to a first variation of the first embodiment.

In a light detector 110 according to the first variation, as shown in FIG. 11, an insulator 42 is provided in the first opening OP1. The insulator 42 is connected with the lens 40. The insulator 42 is surrounded by the insulating layer 30 along the X-Y plane. The resin included in the insulator 42 is the same as the resin included in the lens 40.

The center of the lens 40 in the X-Y plane may be deviated from the center of the junction region 10 in the X-Y plane. Due to this scaling, the difference between the sensitivity at the center of the junction region 10 and the sensitivity at the outer periphery of the junction region 10 can be reduced. When forming the scaled lens 40, the first opening OP1 is covered with the resin layer 40a during the reflowing of the resin layer 40a. During the reflowing, the resin flows into the first opening OP1 to form the insulator 42.

Alternatively, even when scaling is not performed similarly to the light detector 100, there is a possibility that the resin flows into the first opening OP1 during the reflowing. In the light detector 100, similarly to the light detector 110, the insulator 42 may be provided in the first opening OP1. In this case, the insulator 42 may be connected with the lens 40 or may be separated from the lens 40.

When the lens 40 and the insulator 42 include the same resin, the difference in refractive index between the lens 40 and the insulator 42 can be reduced. When the insulator 42 is connected with the lens 40, there is no interface between the lens 40 and the insulator 42. In comparison with the case where the resin of the lens 40 is different from the resin of the insulator 42, the reflection of the light between the lens 40 and the insulator 42 can be suppressed. For example, when the light traveling downward passes between the lens 40 and the insulator 42, irregular reflection of the light can be suppressed, and the light reception sensitivity of the light detector 110 can be improved.

[Second Variation]

Figure 12:
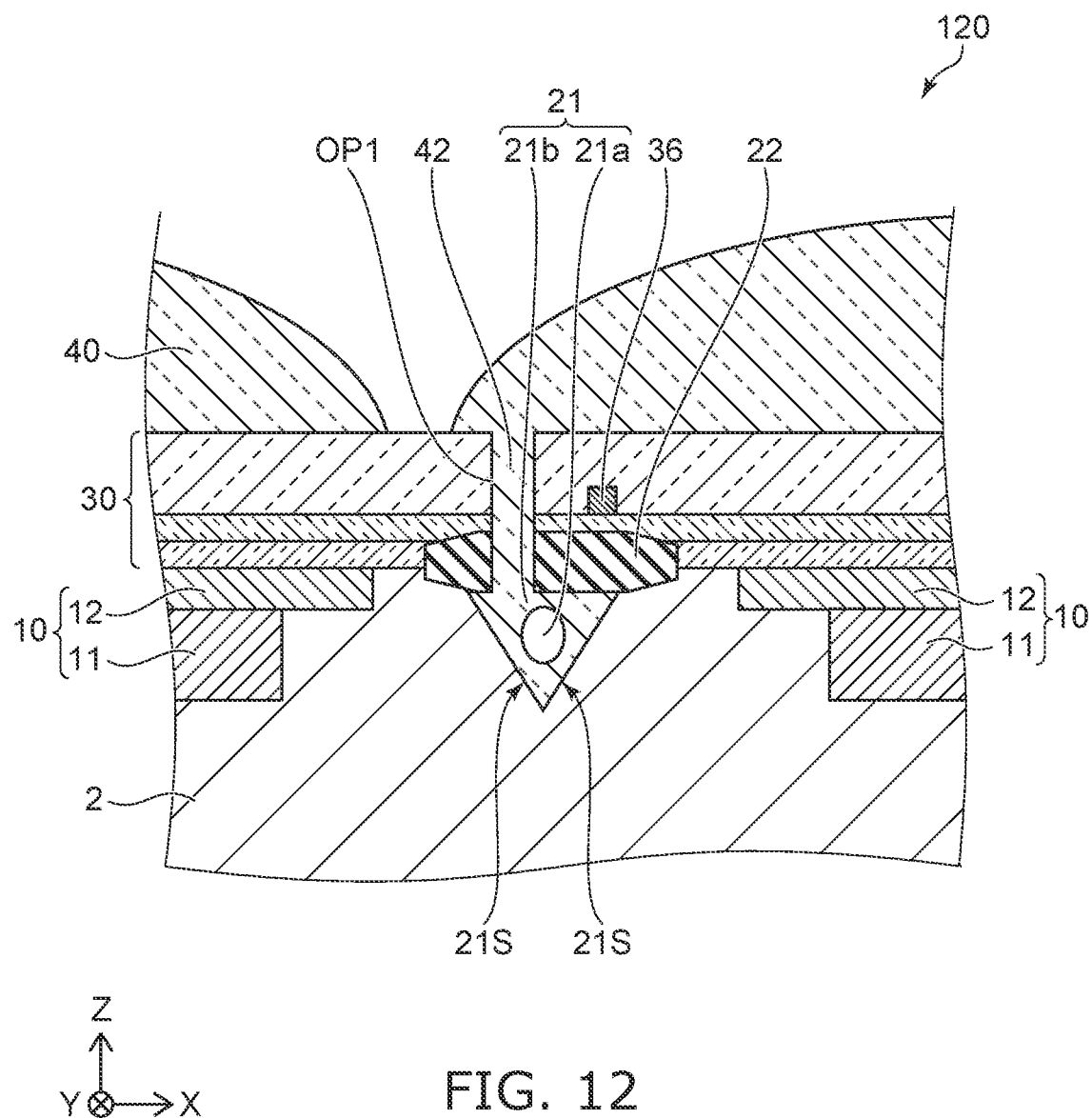
FIG. 12 is a cross-sectional view showing a light detector according to a second variation of the first embodiment.

FIG. 12 is a cross-sectional view showing a light detector according to a second variation of the first embodiment.

In a light detector 120 according to the second variation, as shown in FIG. 12, the first insulating portion 21 includes the void 21a and an insulating region 21b.

The insulating region 21b is provided between the semiconductor layer 2 and the void 21a. The inclined surface 21S is an interface between the semiconductor layer 2 and the insulating region 21b. The insulating region 21b is connected with the insulator 42. The insulating region 21b includes an insulating resin. The resin included in the insulating region 21b is the same as the resin included in the insulator 42 and the resin included in the lens 40.

According to the light detector 120, like the light detector 100, the secondary photons P are reflected downward by the inclined surface 21S. Some of the secondary photons that are not reflected by the inclined surface 21S are reflected upward or downward by the interface between the void 21a and the insulating region 21b. Accordingly, the crosstalk in the light detector 120 can be suppressed.

It is favorable that the inclination θ of the inclined surface 21S with respect to the Z-direction is larger than 25 degrees as described above in order to reflect more secondary photons on the inclined surface 21S.

The insulating region 21b and the insulator 42 may include oxides or nitrides other than the resin. For example, the insulating region 21b and the insulator 42 include silicon and one selected from the group consisting of oxygen, and nitrogen. For example, after the processes shown in FIGS. 7A and 7B and before the formation of the resin layer 40a, the insulating region 21b and the insulator 42 are formed by CVD. In this case, the insulator 42 is connected with the insulating region 21b and is not connected with the lens 40. An interface is formed between the lens 40 and the insulator 42.

For example, the refractive index of silicon oxide or silicon nitride is about 2.0. For this reason, when the inclination θ of the inclined surface 21S with respect to the Z-direction is larger than 25 degrees, even in a case where the insulating region 21b includes any of a resin, an oxide, and a nitride, the secondary photons can be appropriately reflected by the inclined surface 21S.

[Third Variation]

Figure 13:
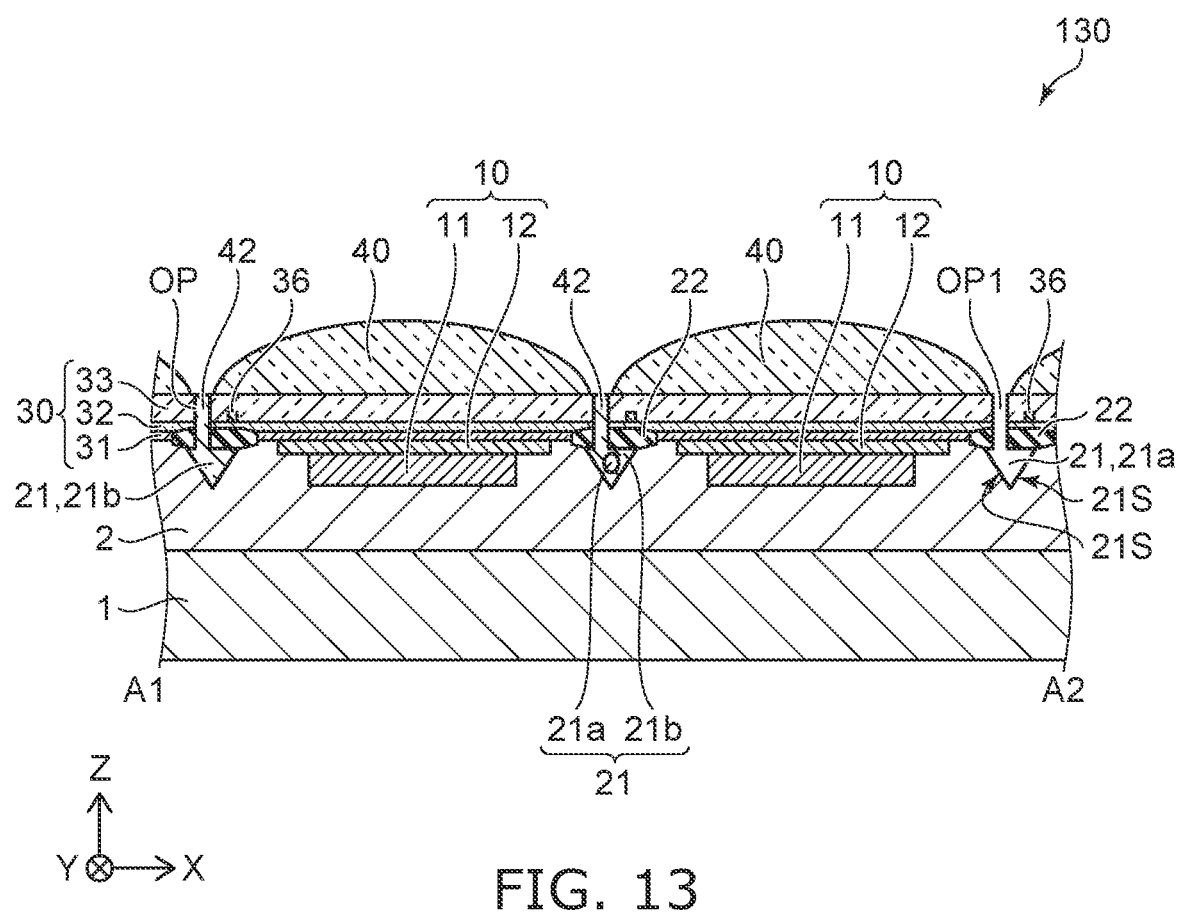
FIG. 13 is a cross-sectional view showing a light detector according to a third variation of the first embodiment.

FIG. 13 is a cross-sectional view showing a light detector according to a third variation of the first embodiment.

Similarly to a light detector 130 according to the third variation shown in FIG. 13, the insulator 42 may be provided in a portion of the first opening OP1. The insulator 42 is not provided in another portion of the first opening OP1. A portion of the first insulating portion 21 may include the insulating region 21b. Another portion of the first insulating portion 21 includes only the insulating region 21b and may not include the void 21a. Still another portion of the first insulating portion 21 does not include the insulating region 21b and is formed of only the void 21a.

At least a portion of the multiple first insulating portions 21 includes the void 21a, so that the crosstalk in the light detector 130 can be suppressed in comparison with the case where none of the first insulating portions 21 includes the void 21a.

[Fourth Variation]

Figure 14:
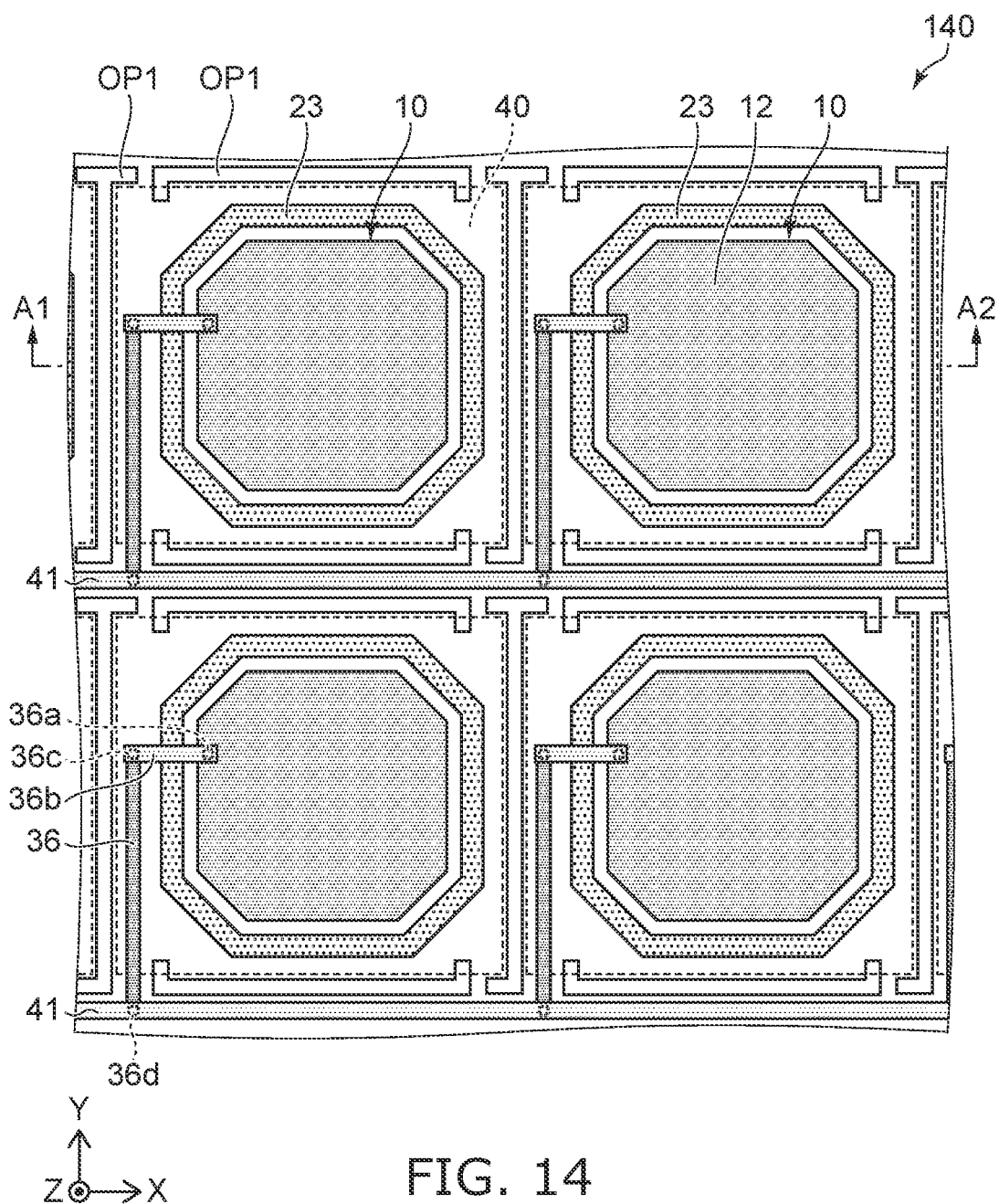
FIG. 14 is a plan view showing a light detector according to a fourth variation of the first embodiment.
Figure 15:
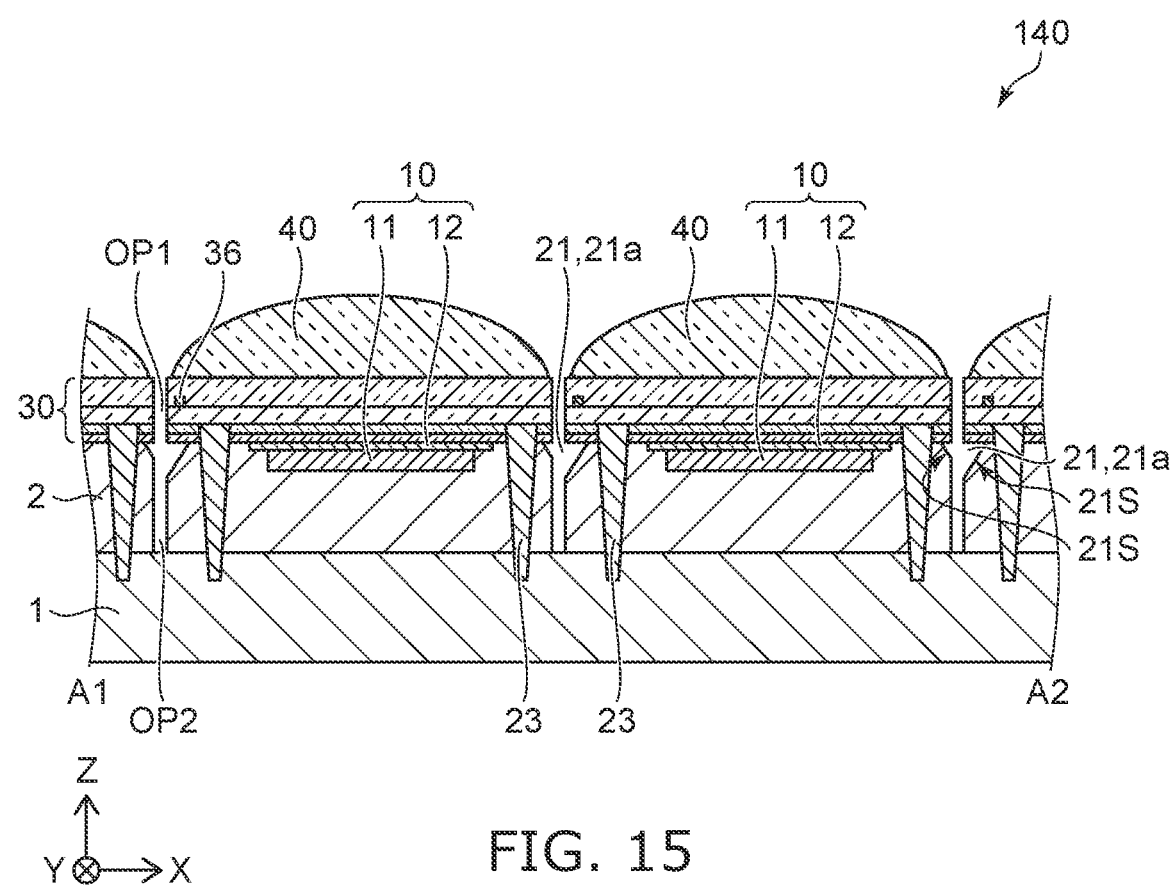
FIG. 15 is a cross-sectional view taken along the line A1-A2 of FIG. 14.

FIG. 14 is a plan view showing a light detector according to a fourth variation of the first embodiment. FIG. 15 is a cross-sectional view taken along the line A1-A2 of FIG. 14.

In FIG. 14, the lens 40 is shown by a broken line, and the first insulating portion 21 and the insulating layer 30 are omitted. As shown in FIG. 14, a light detector 140 according to the fourth variation further includes a third insulating portion 23.

The third insulating portion 23 is provided around the junction region 10 along the X-Y plane. As shown in FIG. 15, the third insulating portion 23 is located between the junction region 10 and the first insulating portion 21. For example, the first semiconductor region 11 and the second semiconductor region 12 are separated from the third insulating portion 23. The first semiconductor region 11 and the second semiconductor region 12 may be in contact with the third insulating portion 23. The lower end of the third insulating portion 23 is located below the inclined surface 21S of the first insulating portion 21. For example, the lower end of the third insulating portion 23 reaches the semiconductor layer 1. The inclination of the interface between the third insulating portion 23 and the semiconductor layer 2 with respect to the Z-direction is smaller than the inclination of the inclined surface 21S with respect to the Z-direction.

A second opening OP2 leading to the void 21a may be provided under the first insulating portion 21. The second opening OP2 is located under the first opening OP1. When viewed from the Z-direction, the second opening OP2 overlaps the first opening OP1. The second opening OP2 is located between the adjacent third insulating portions 23. For example, the lower end of the second opening OP2 is located above the lower end of the third insulating portion 23. The second opening OP2 is provided, so that the stress generated in the semiconductor layer 2 can be reduced. For example, the possibility of occurrence of damage to the semiconductor layer 1 or 2 can be reduced. Alternatively, the warpage of the light detector 140 can be reduced.

Figure 16:
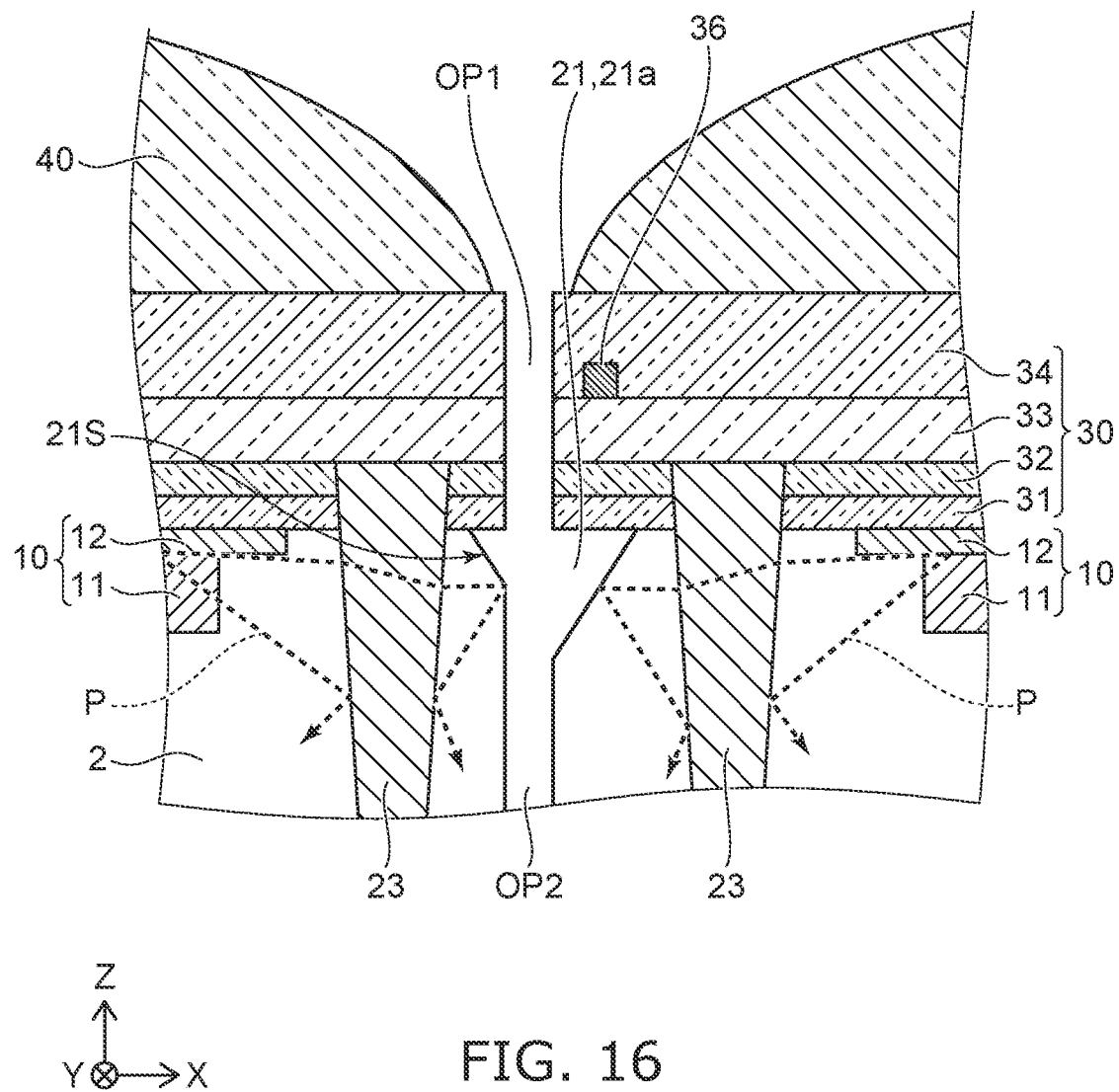
FIG. 16 is an enlarged cross-sectional view of a portion of FIG. 15.

FIG. 16 is an enlarged cross-sectional view of a portion of FIG. 15.

The insulating layer 30 includes a first layer 31 to a fourth layer 34. The fourth layer 34 is provided on the third layer 33. The first layer 31, the third layer 33, and the fourth layer 34 include silicon oxide. The second layer 32 includes silicon nitride.

As shown in FIG. 16, some of the secondary photons P generated in the junction region 10 travel the third insulating portion 23 toward the first insulating portion 21 and is reflected by the inclined surface 21S. The secondary photons P traveling below the inclined surface 21S are reflected by the interface between the semiconductor layer 2 and the third insulating portion 23. The third insulating portion 23 is provided, so that the secondary photons P traveling below the inclined surface 21S can be reflected. According to the light detector 140 according to the fourth variation, the crosstalk can be further suppressed in comparison with the light detector 100.

FIGS. 17A to 20B are schematic views showing a method for manufacturing the light detector according to the fourth variation of the first embodiment.

FIGS. 17B, 18B, 19B, and 20B show B1-B2 cross sections of FIGS. 17A, 18A, 19A, and 20A, respectively. In FIGS. 17A, 18A, 19A, and 20A, the insulating layer 30 is omitted.

Figure 17A:
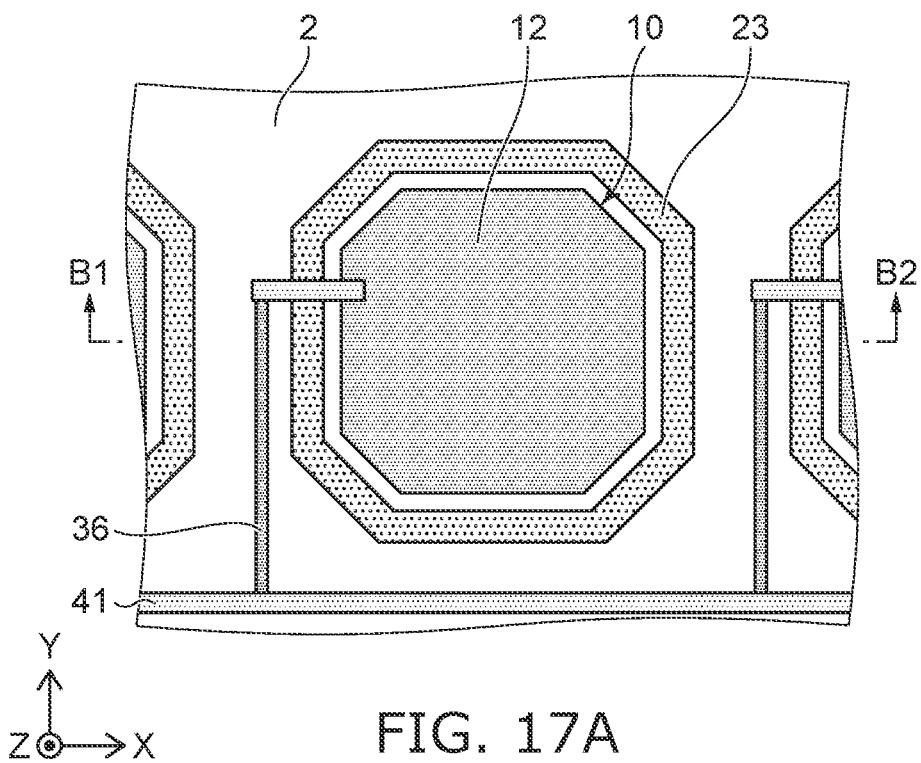
FIGS. 17A and 17B are schematic views showing a method for manufacturing the light detector according to the fourth variation of the first embodiment.
Figure 17B:
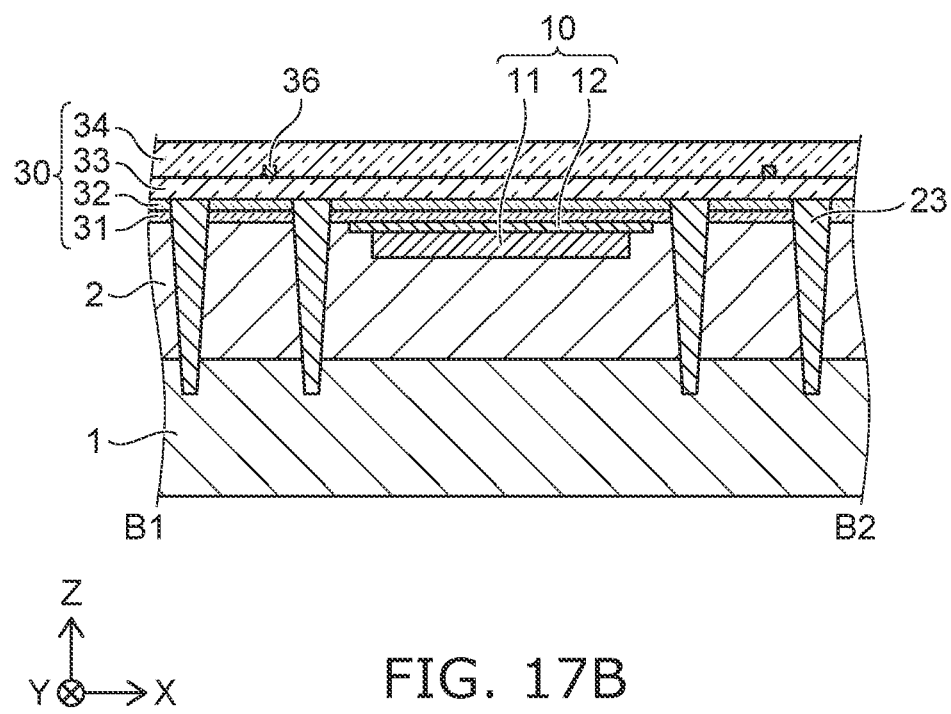

As shown in FIGS. 17A and 17B, the semiconductor layer 2, the junction region 10, the third insulating portion 23, the insulating layer 30, and the quenching part 36 are formed on the semiconductor layer 1 which is a semiconductor substrate, by a known method. For example, the third insulating portion 23 is formed by forming an opening penetrating the semiconductor layer 1, the semiconductor layer 2, the first layer 31, and the second layer 32 by RIE and burying the opening with an insulating material by CVD.

Figure 18A:
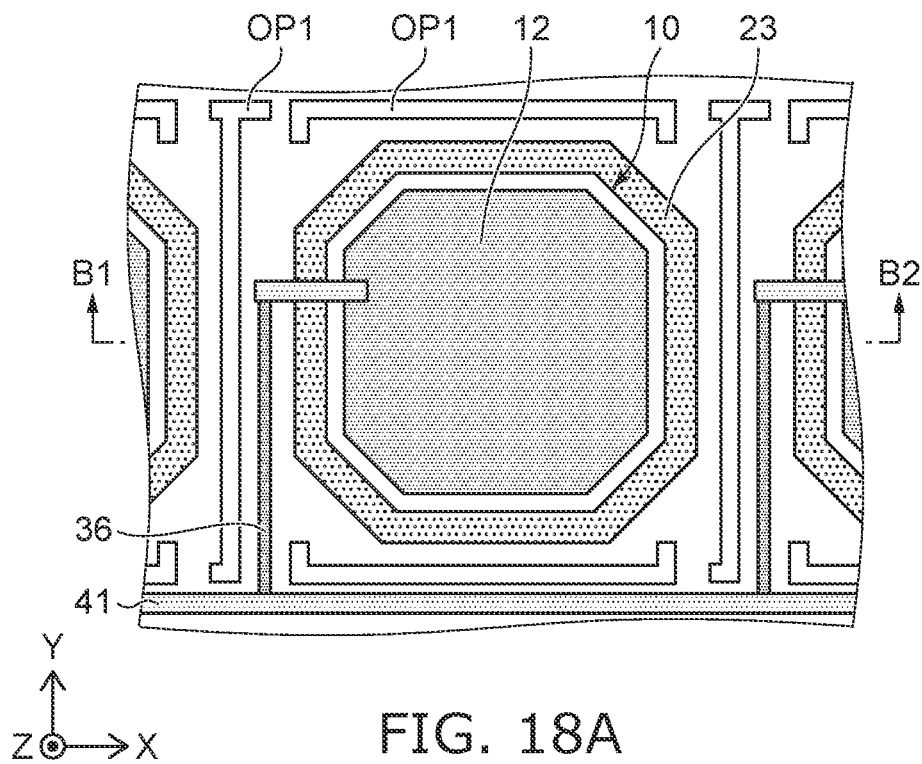
FIGS. 18A and 18B are schematic views showing a method for manufacturing the light detector according to the fourth variation of the first embodiment.
Figure 18B:
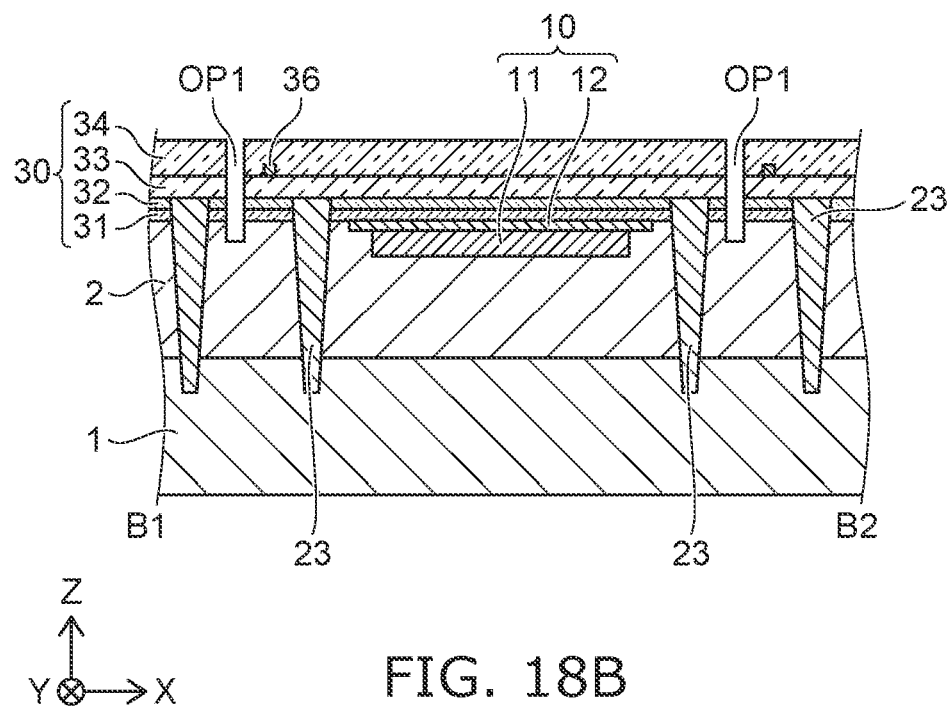

As shown in FIGS. 18A and 18B, the multiple first openings OP1 penetrating the insulating layer 30 are formed by photolithography and RIE. When viewed from the Z-direction, the third insulating portion 23 is located between the first opening OP1 and the junction region 10.

Figure 19A:
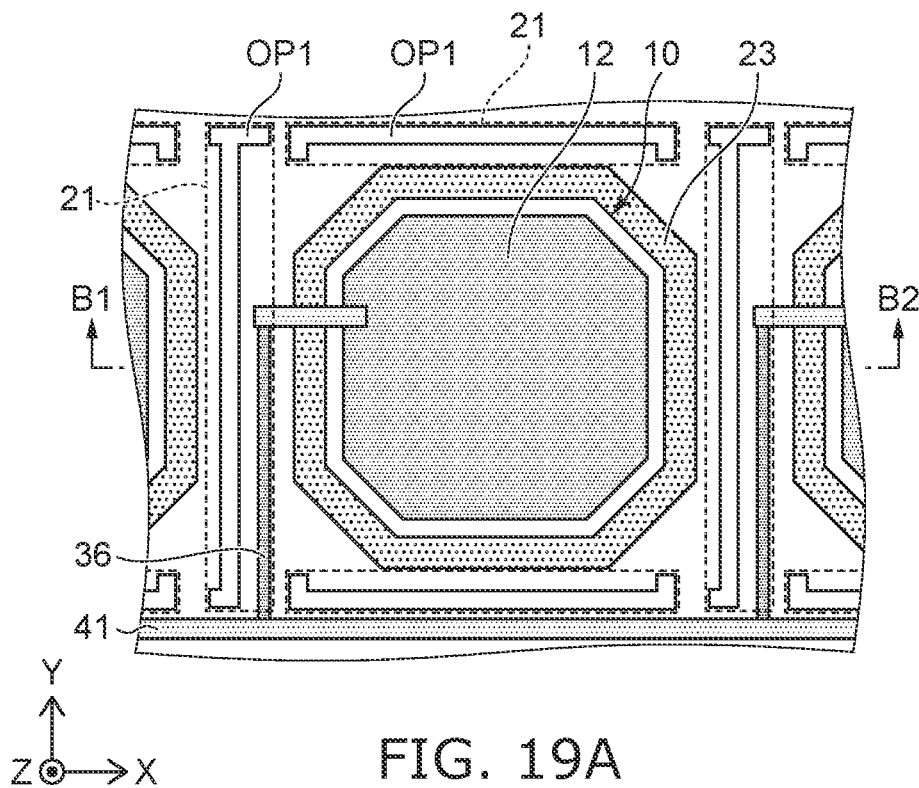
FIGS. 19A and 19B are schematic views showing a method for manufacturing the light detector according to the fourth variation of the first embodiment.
Figure 19B:
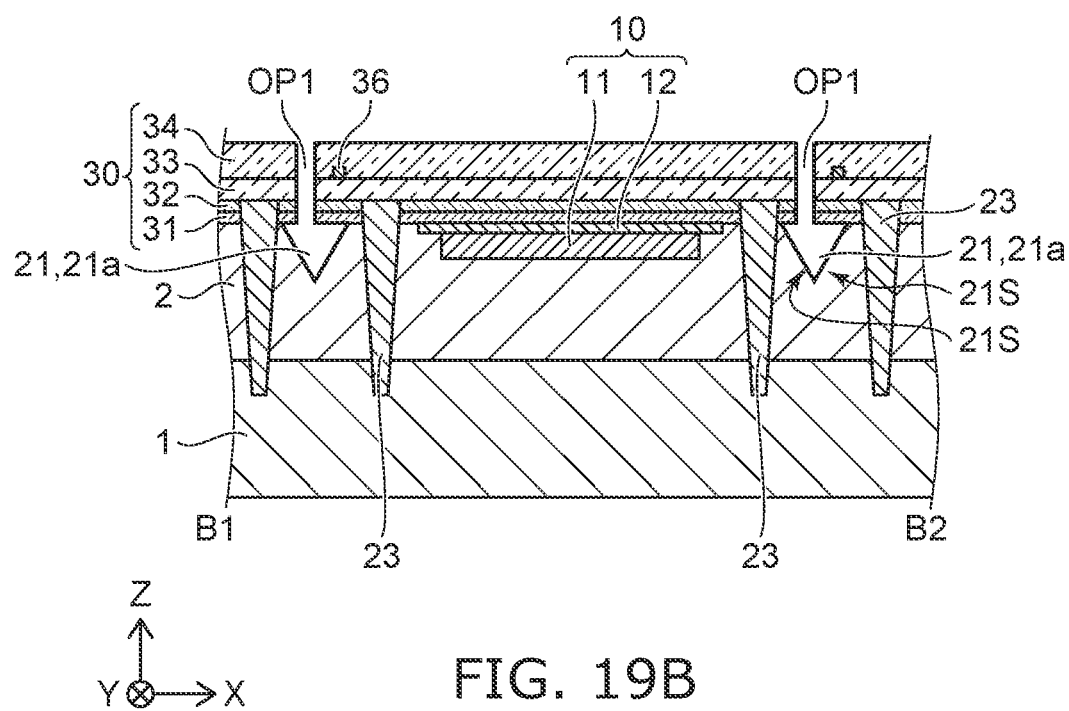

As shown in FIGS. 19A and 19B, a portion of the semiconductor layer 2 is removed through the first opening OP1 by wet etching. Accordingly, the first insulating portion 21 including the void 21a and having the inclined surface 21S is formed.

Figure 20A:
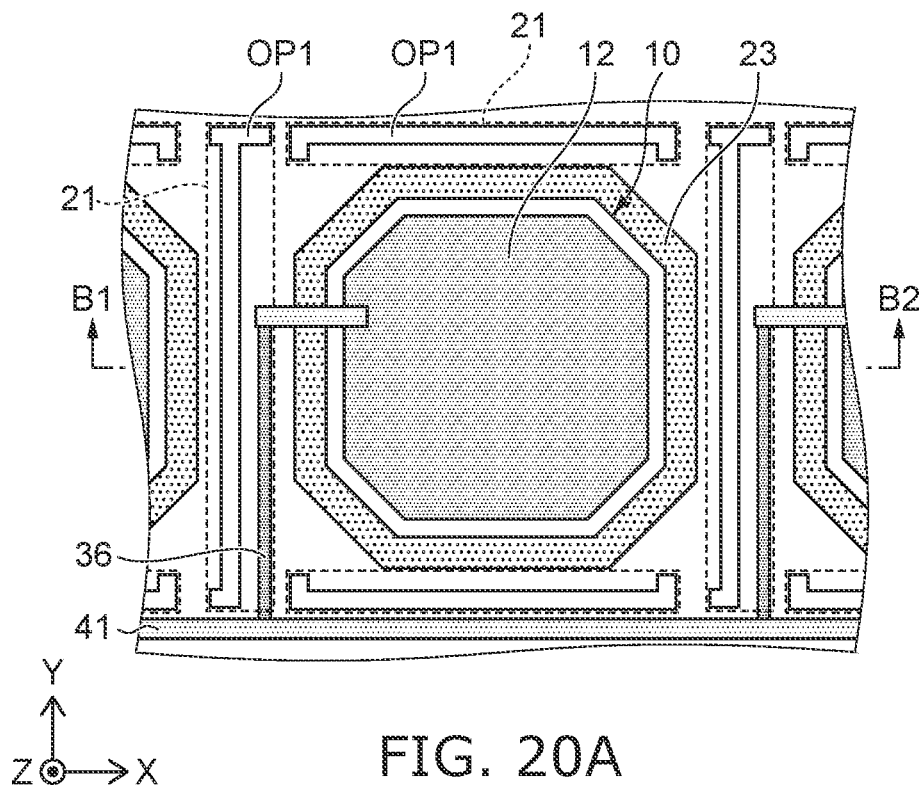
FIGS. 20A and 20B are schematic views showing a method for manufacturing the light detector according to the fourth variation of the first embodiment.
Figure 20B:
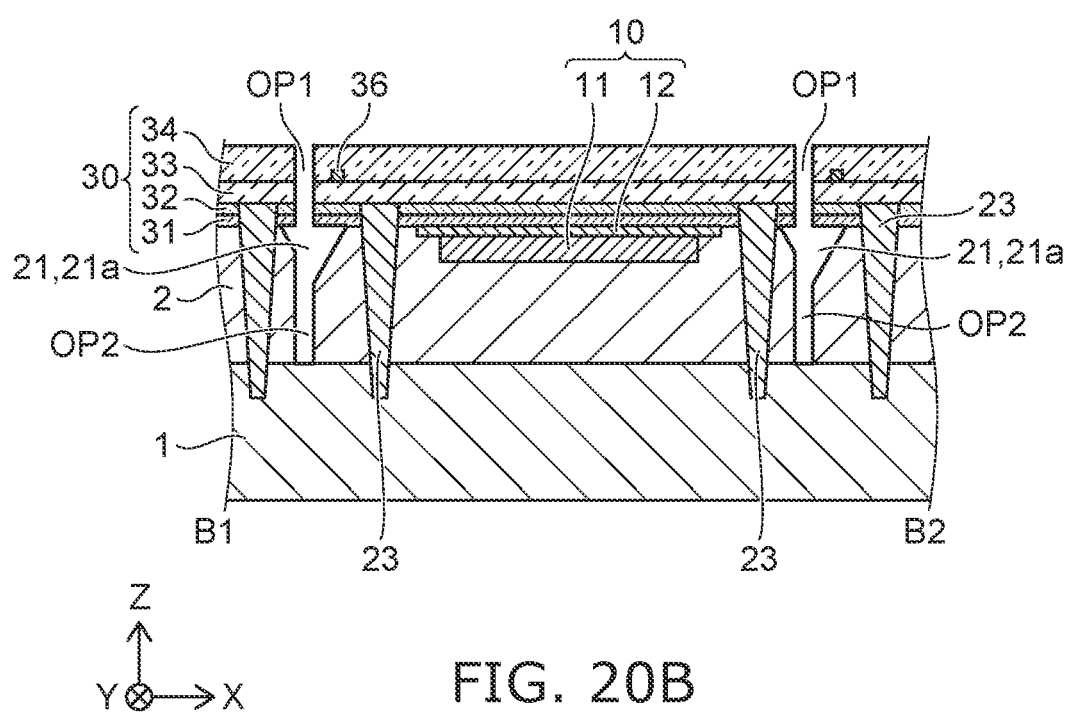

As shown in FIGS. 20A and 20B, a portion of the semiconductor layer 2 is further removed through the first opening OP1 by RIE. Accordingly, the second opening OP2 communicating with the void 21a is formed under the first insulating portion 21.

After that, similarly to the processes shown in FIGS. 9A and 9B, the resin layer 40a is formed on the insulating layer 30, and the resin layer 40a is patterned. Similarly to the processes shown in FIGS. 10A and 10B, the resin layer 40a is allowed to reflow to form the lens 40. Through the above-described processes, the light detector 140 according to the fourth variation is manufactured.

[Fifth Variation]

Figure 21:
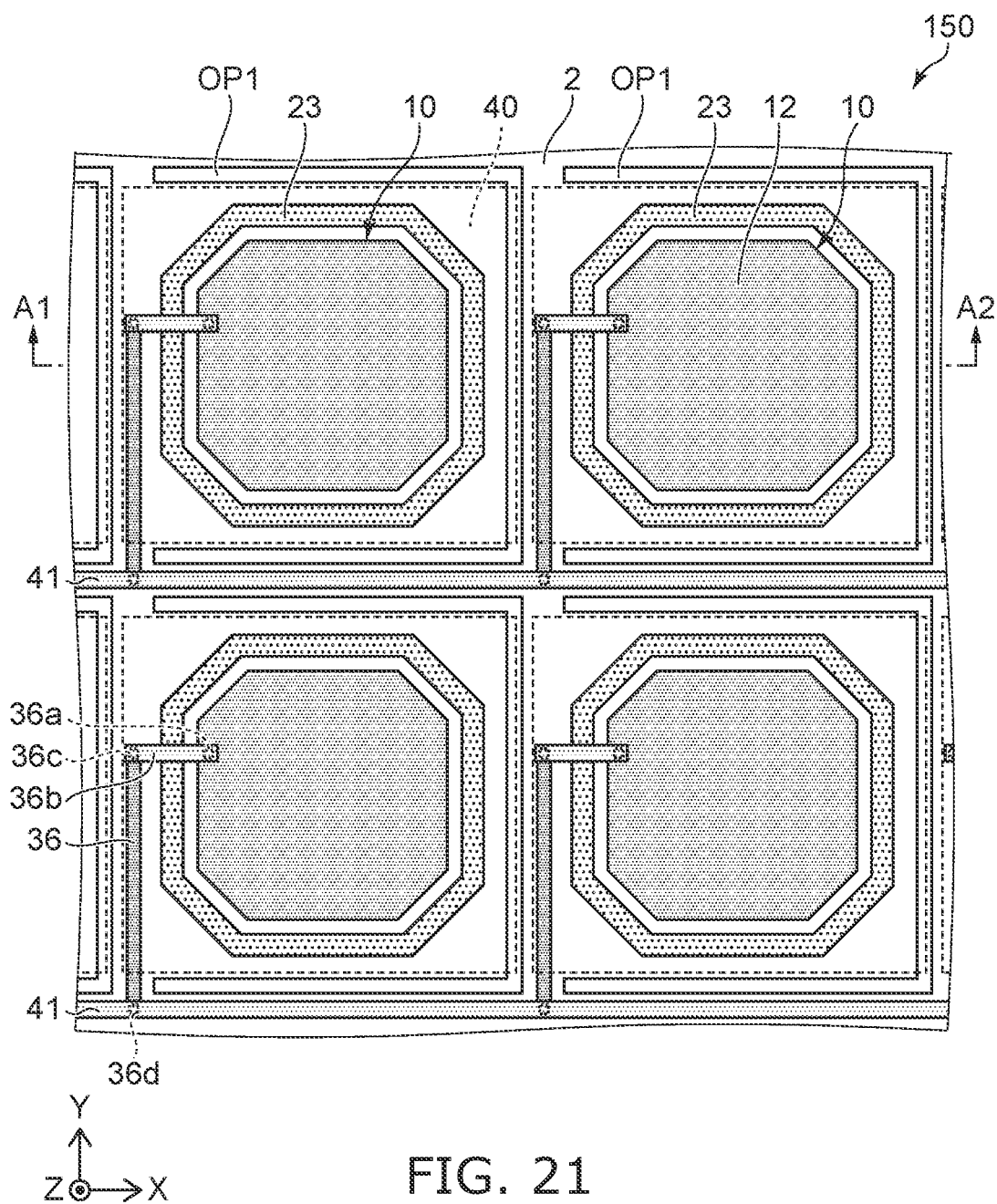
FIG. 21 is a plan view showing a light detector according to a fifth variation of the first embodiment.
Figure 22:
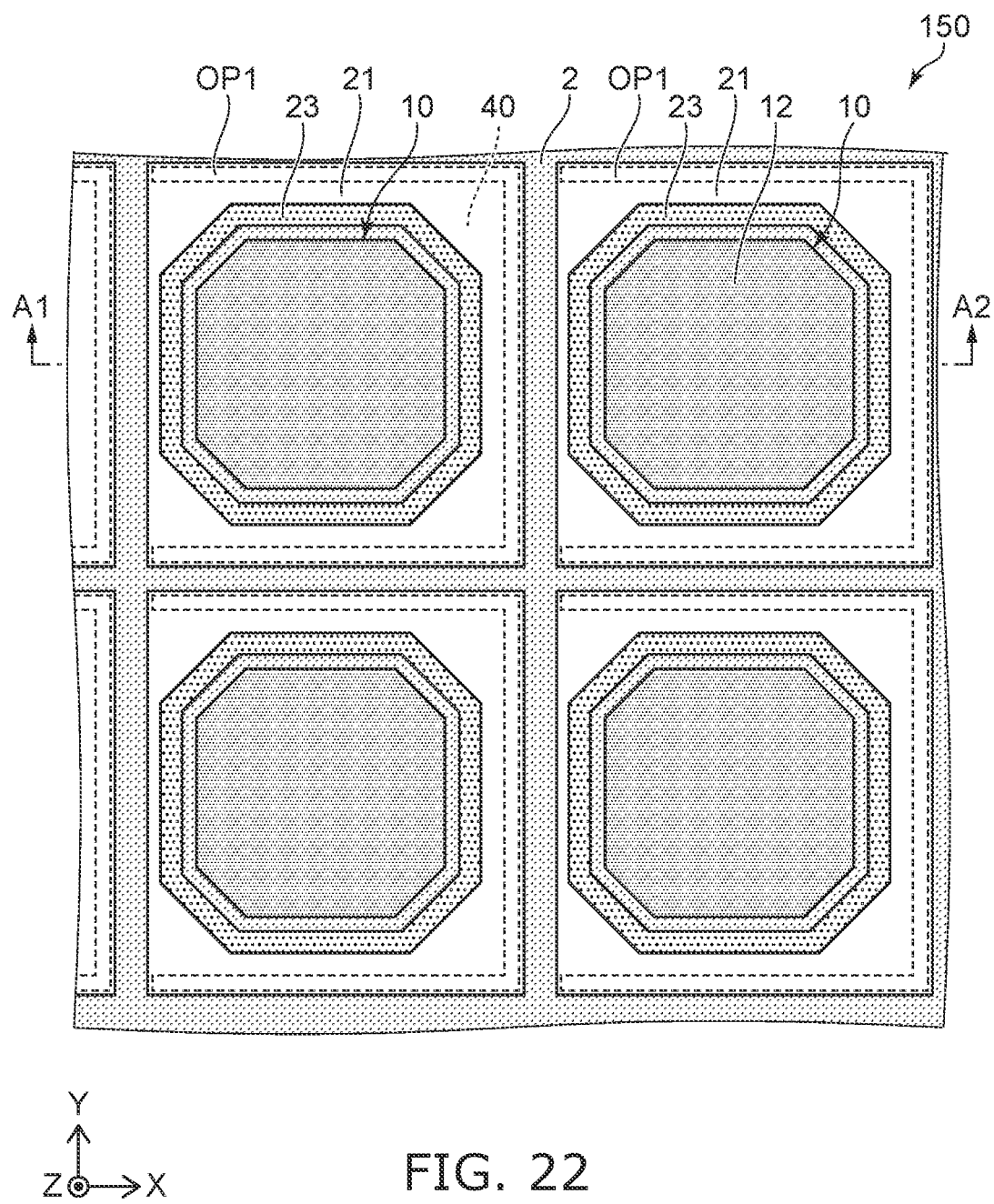
FIG. 22 is a plan view showing a light detector according to a fifth variation of the first embodiment.
Figure 23:
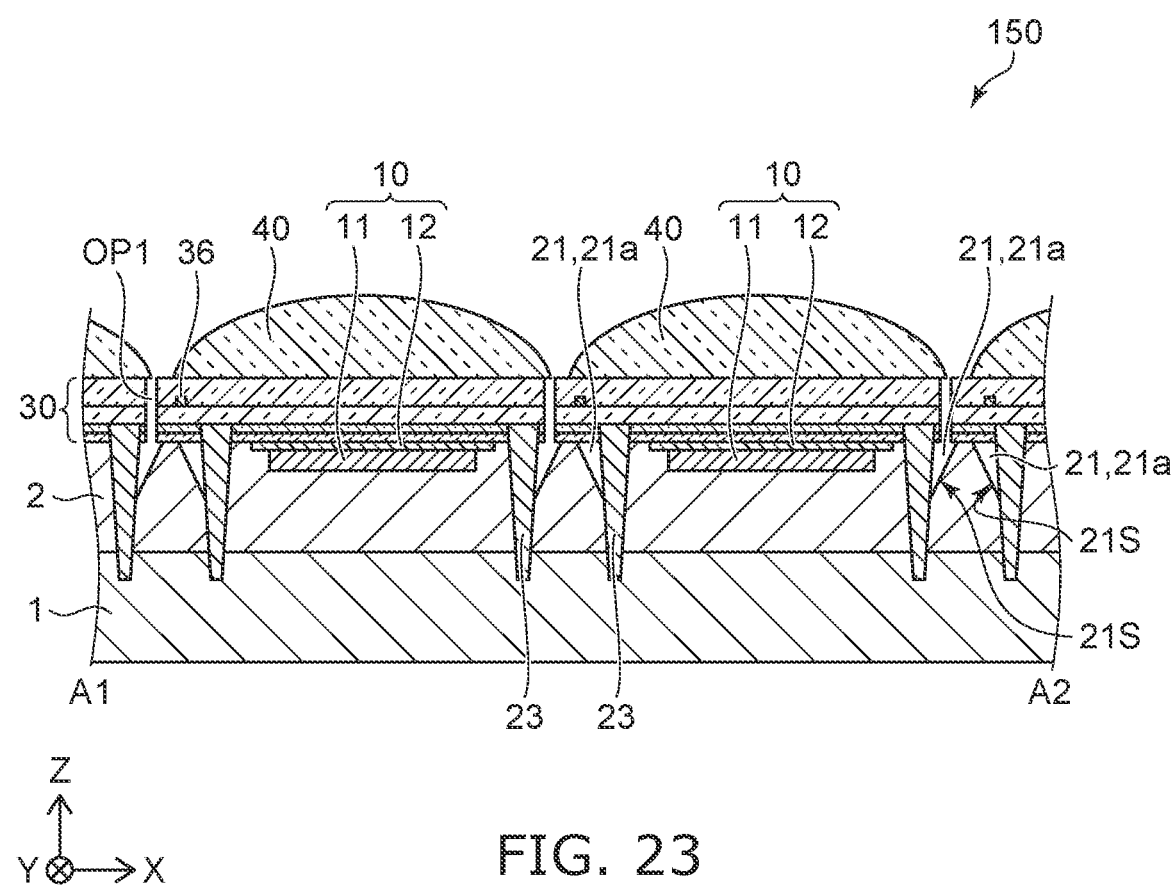
FIG. 23 is a cross-sectional view taken along the line A1-A2 of FIGS. 21 and 22.

FIGS. 21 and 22 are plan views showing a light detector according to a fifth variation of the first embodiment. FIG. 23 is a cross-sectional view taken along the line A1-A2 of FIGS. 21 and 22.

In FIG. 21, the lens 40 is shown by a broken line, and the first insulating portion 21 and the insulating layer 30 are omitted. In FIG. 22, the insulating layer 30, the quenching part 36, the lens 40, and the first interconnect 41 are omitted.

A light detector 150 according to the fifth variation is different from the light detector 100 in terms of the shape of the first opening OP1 and the shape of the first insulating portion 21. As shown in FIG. 21, in the light detector 150 according to the fifth variation, the shape of one first opening OP1 has an U shape when viewed from the Z-direction. The shape of one first opening OP1 may have an L shape when viewed from the Z-direction. As shown in FIG. 22, the shape of one first insulating portion 21 is a quadrangle circumscribing one first opening OP1 when viewed from the Z-direction.

As shown in FIGS. 22 and 23, one first insulating portion 21 is provided around one third insulating portion 23 along the X-Y plane. When the semiconductor layer 2 is wet-etched through the first opening OP1, the etching toward the junction region 10 is stopped by the third insulating portion 23. Accordingly, the first insulating portion 21 configured with the void 21a is formed around the third insulating portion 23.

Figure 24:
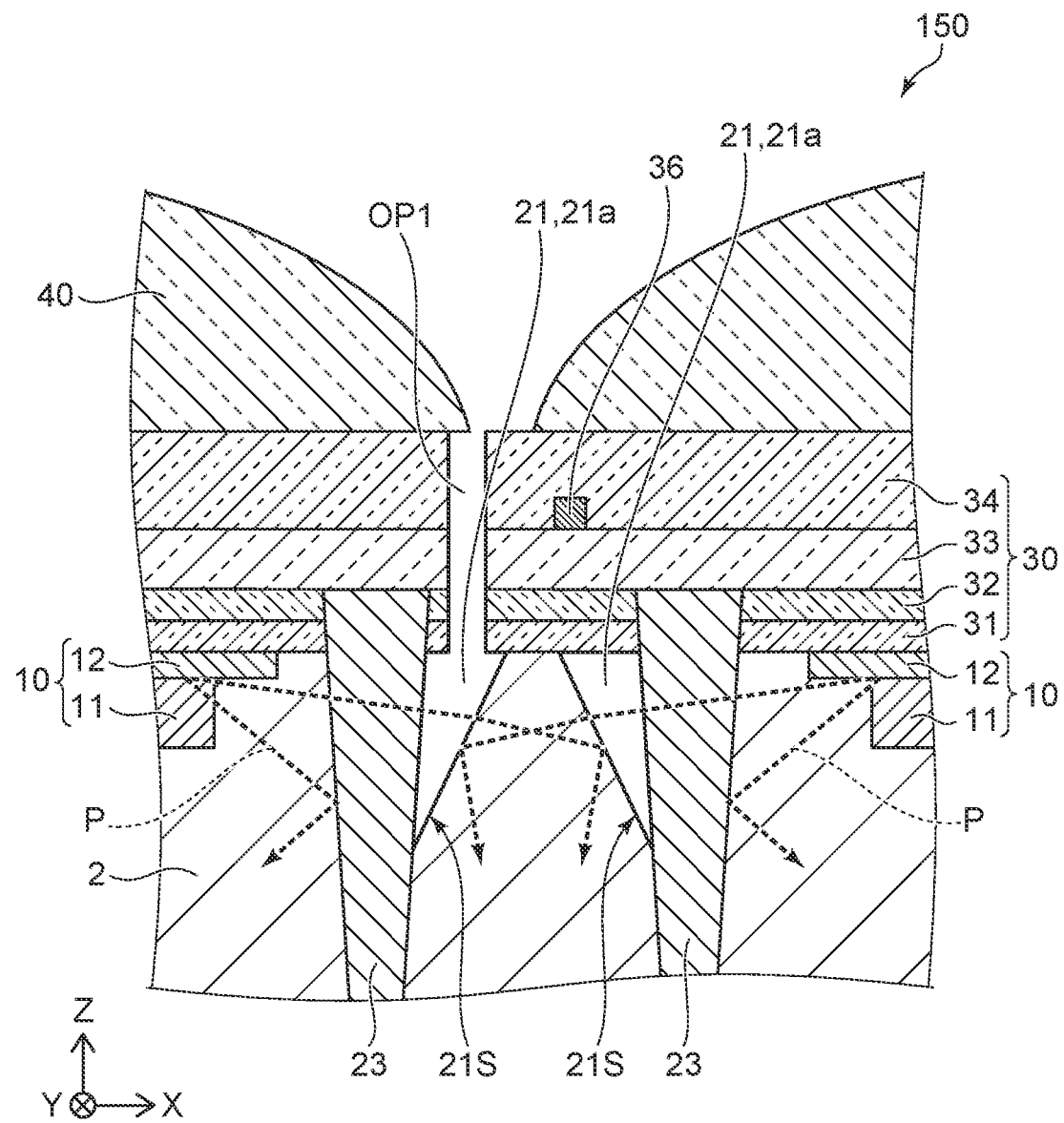
FIG. 24 is an enlarged cross-sectional view of a portion of FIG. 23.

FIG. 24 is an enlarged cross-sectional view of a portion of FIG. 23. As shown in FIG. 24, the inclined surface 21S of one first insulating portion 21 surrounds one junction region 10 along the X-Y plane. One inclined surface 21S faces outward. The outer direction is a direction from the one junction region 10 toward one first insulating portion 21.

For example, some of the secondary photons P generated in the junction region 10 pass through the first insulation portion 21 surrounding the junction region 10 and travel to another adjacent first insulation portion 21. The secondary photons P are reflected by the inclined surface 21S of the other first insulating portion 21. The secondary photons P traveling below the inclined surface 21S are reflected by the interface between the semiconductor layer 2 and the third insulating portion 23. According to the light detector 150 according to the fifth variation, similarly to light detector 140, the crosstalk can be suppressed.

Figure 25:
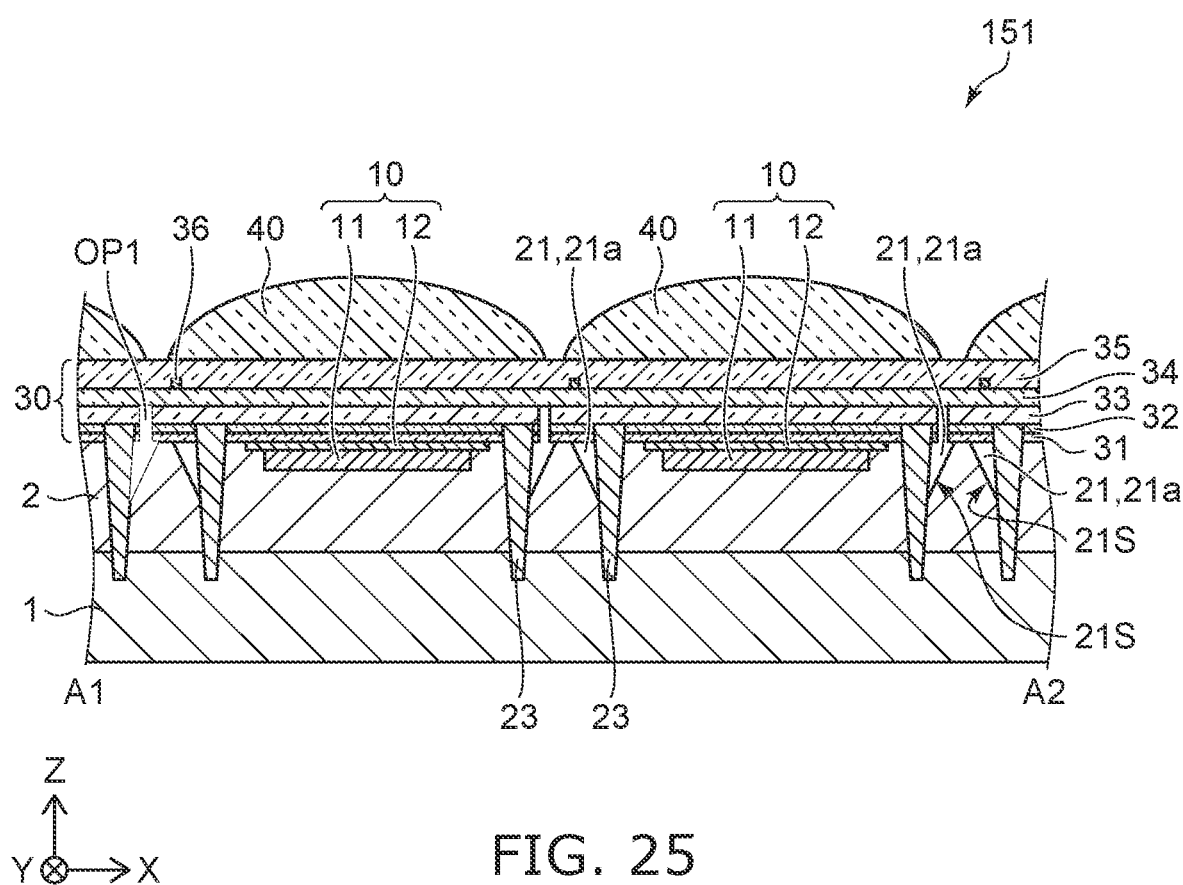
FIG. 25 is a cross-sectional view showing another light detector according to the fifth variation of the first embodiment.

FIG. 25 is a cross-sectional view showing another light detector according to the fifth variation of the first embodiment.

Like a light detector 151 shown in FIG. 25, the first opening OP1 may be closed by the upper portion of the insulating layer 30. For example, the insulating layer 30 includes a first layer 31 to a fifth layer 35. The fifth layer 35 is provided on the fourth layer 34 and includes silicon oxide. The first opening OP1 penetrates the first layer 31 to the third layer 33 and is covered by the fourth layer 34 and the fifth layer 35. For example, the void 21a is separated from the space outside the light detector 100.

The light detector 151 can be manufactured by the following method. First, the semiconductor layer 2, the junction region 10, the third insulating portion 23, the first layer 31, and the second layer 32 are formed. The third layer 33 is formed on the second layer 32. The first opening OP1 penetrating the first layer 31 to the third layer 33 is formed by RIE. The first insulating portion 21 is formed by wet etching through the first opening OP1. The fourth layer 34 and the fifth layer 35 are formed and cover the first opening OP1. The lens 40 is formed on the insulating layer 30. According to this manufacturing method, it is possible to prevent the resin from flowing into the void 21a during the forming of the lens 40. Accordingly, the secondary photons are more easily reflected on the inclined surface 21S.

[Sixth Variation]

Figure 26:
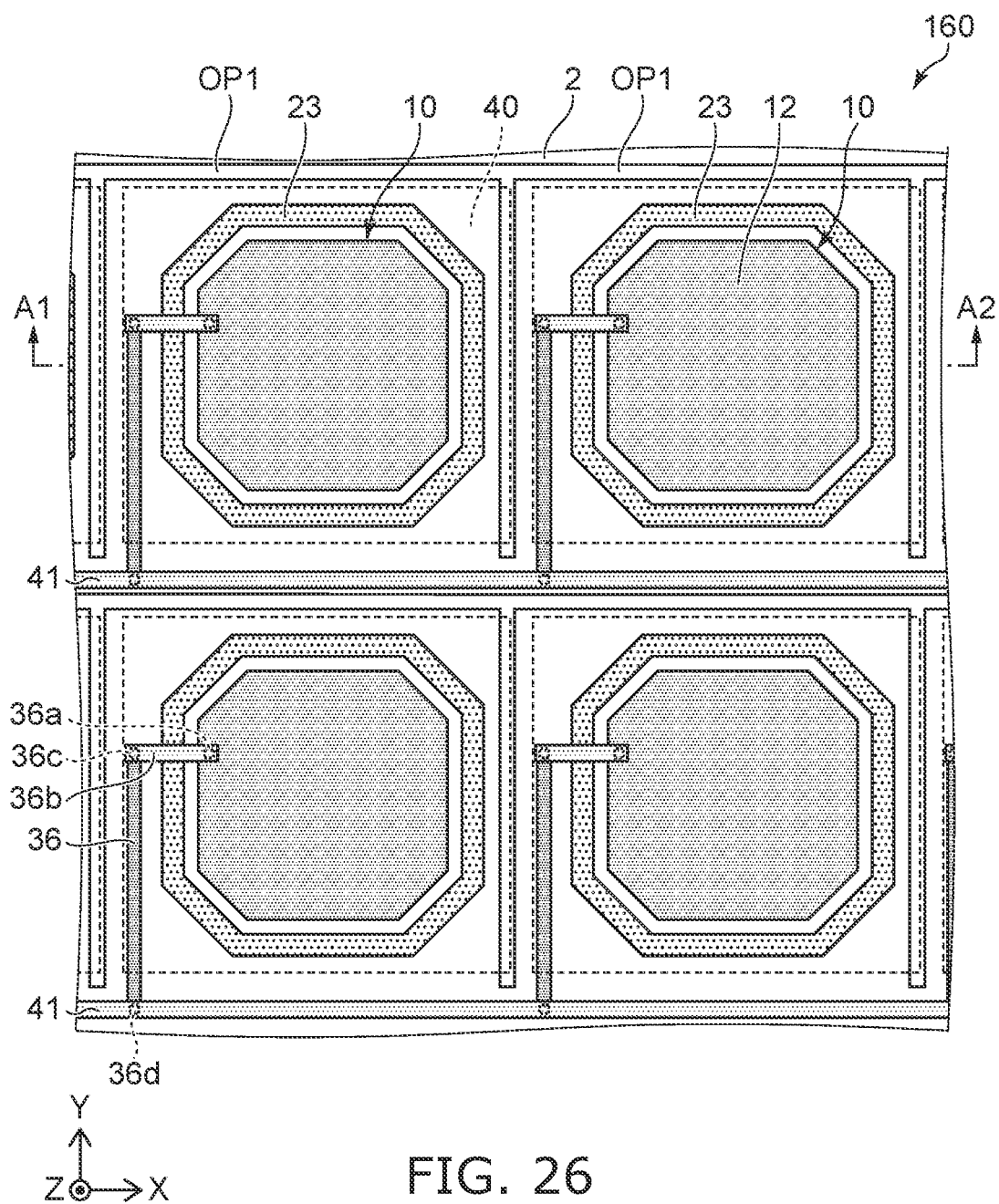
FIG. 26 is a plan view showing a light detector according to a sixth variation of the first embodiment.
Figure 27:
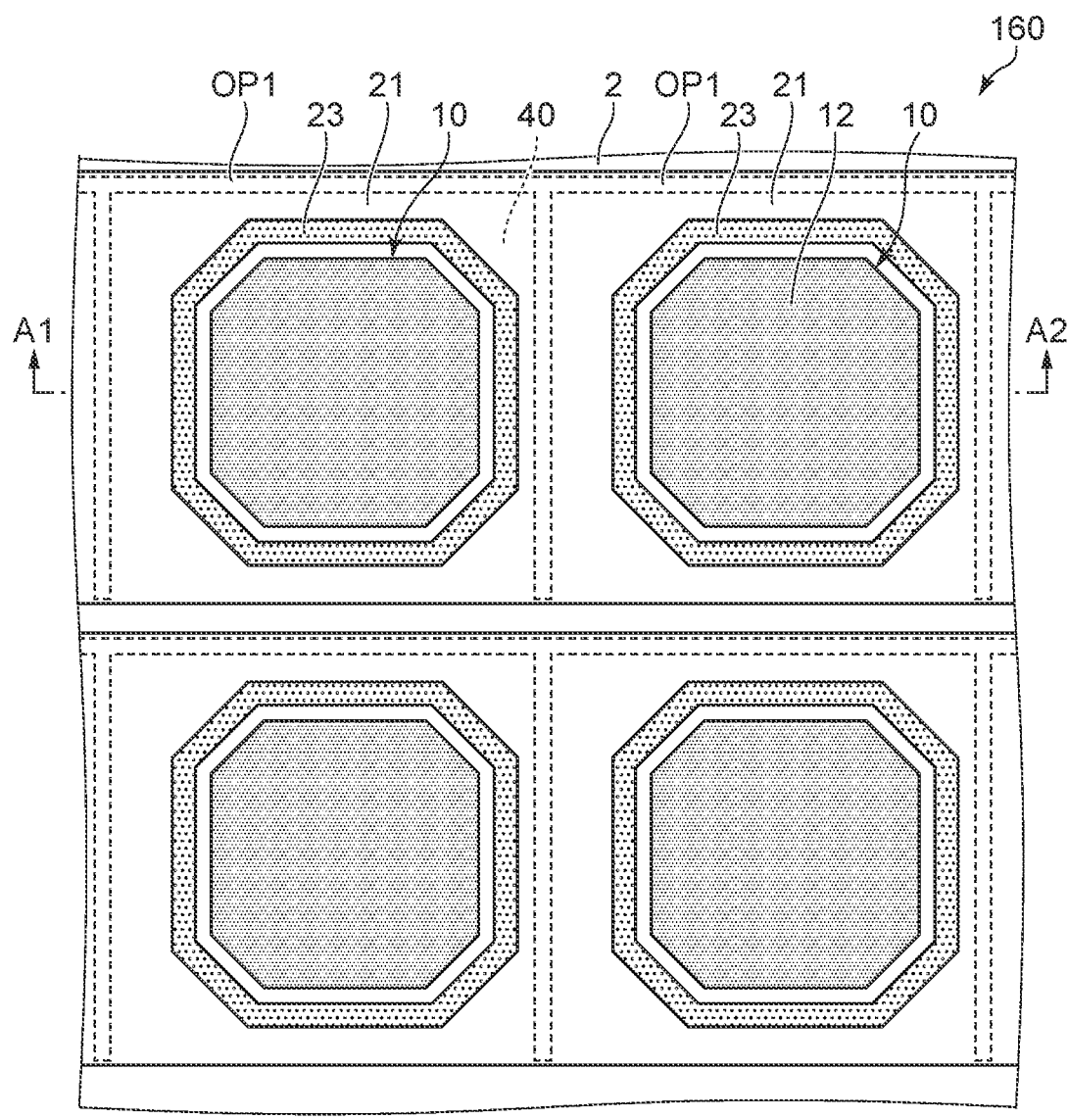
FIG. 27 is a plan view showing the light detector according to the sixth variation of the first embodiment.
Figure 28:
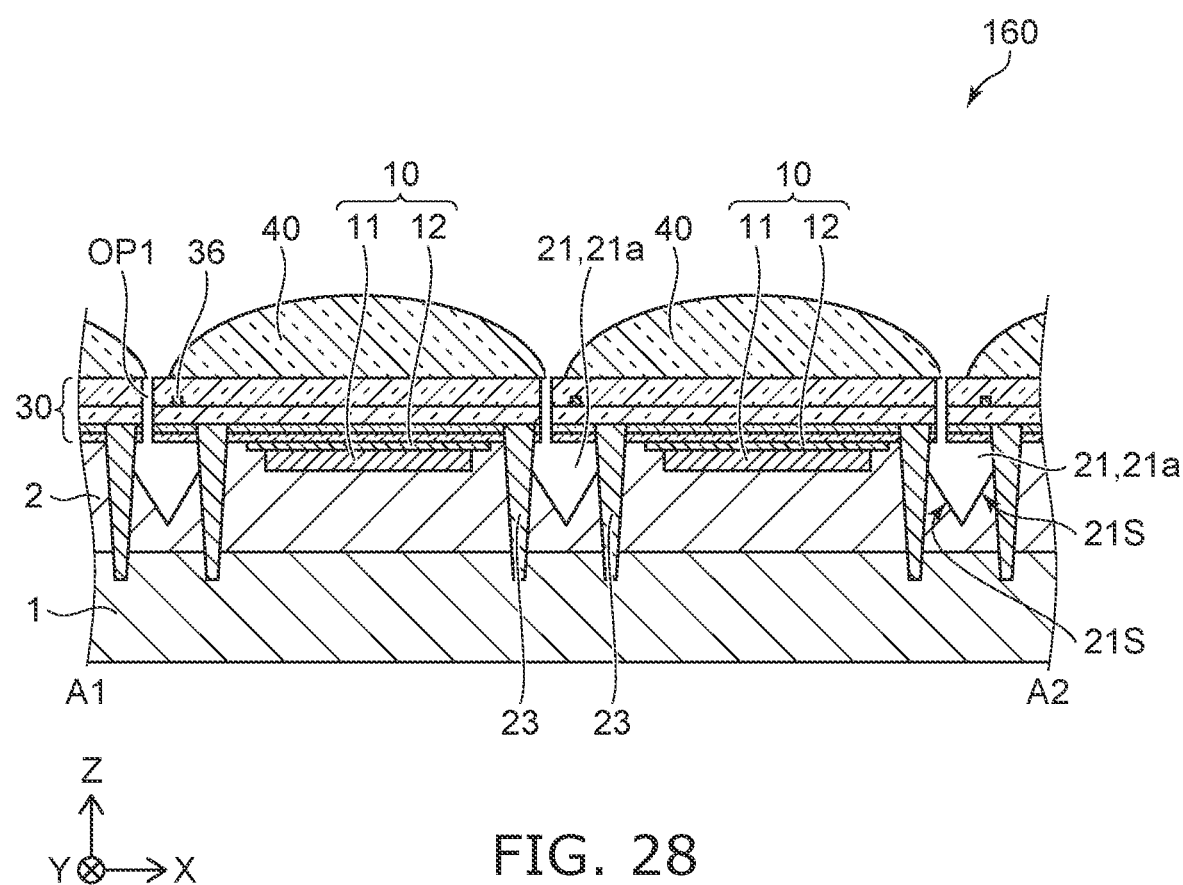
FIG. 28 is a cross-sectional view taken along the line A1-A2 of FIGS. 26 and 27.

FIGS. 26 and 27 are plan views showing a light detector according to a sixth variation of the first embodiment. FIG. 28 is a cross-sectional view taken along the line A1-A2 of FIGS. 26 and 27.

In FIG. 26, the lens 40 is shown by a broken line, and the first insulating portion 21 and the insulating layer 30 are omitted. In FIG. 27, the insulating layer 30, the quenching part 36, the lens 40, and the first interconnect 41 are omitted.

A light detector 160 according to the sixth variation is different from the light detector 100 in terms of the shape of the first opening OP1 and the shape of the first insulating portion 21. As shown in FIG. 26, in the light detector 160 according to the sixth variation, one continuous first opening OP1 is provided for the multiple junction regions 10 aligned in the X-direction. The shape of the first opening OP1 has a comb shape when viewed from the Z-direction. Alternatively, the multiple first opening OP1 that have a T shape when viewed from the Z-direction may be aligned to be separated from each other in the X-direction.

As shown in FIGS. 27 and 28, one first insulating portion 21 is provided around each of the multiple third insulating portions 23 aligned in the X-direction along the X-Y plane. When the semiconductor layer 2 is wet-etched through the first opening OP1, the etching toward the junction region 10 is stopped by the third insulating portion 23, so that the first insulating portion 21 configured with the void 21a is formed.

Figure 29:
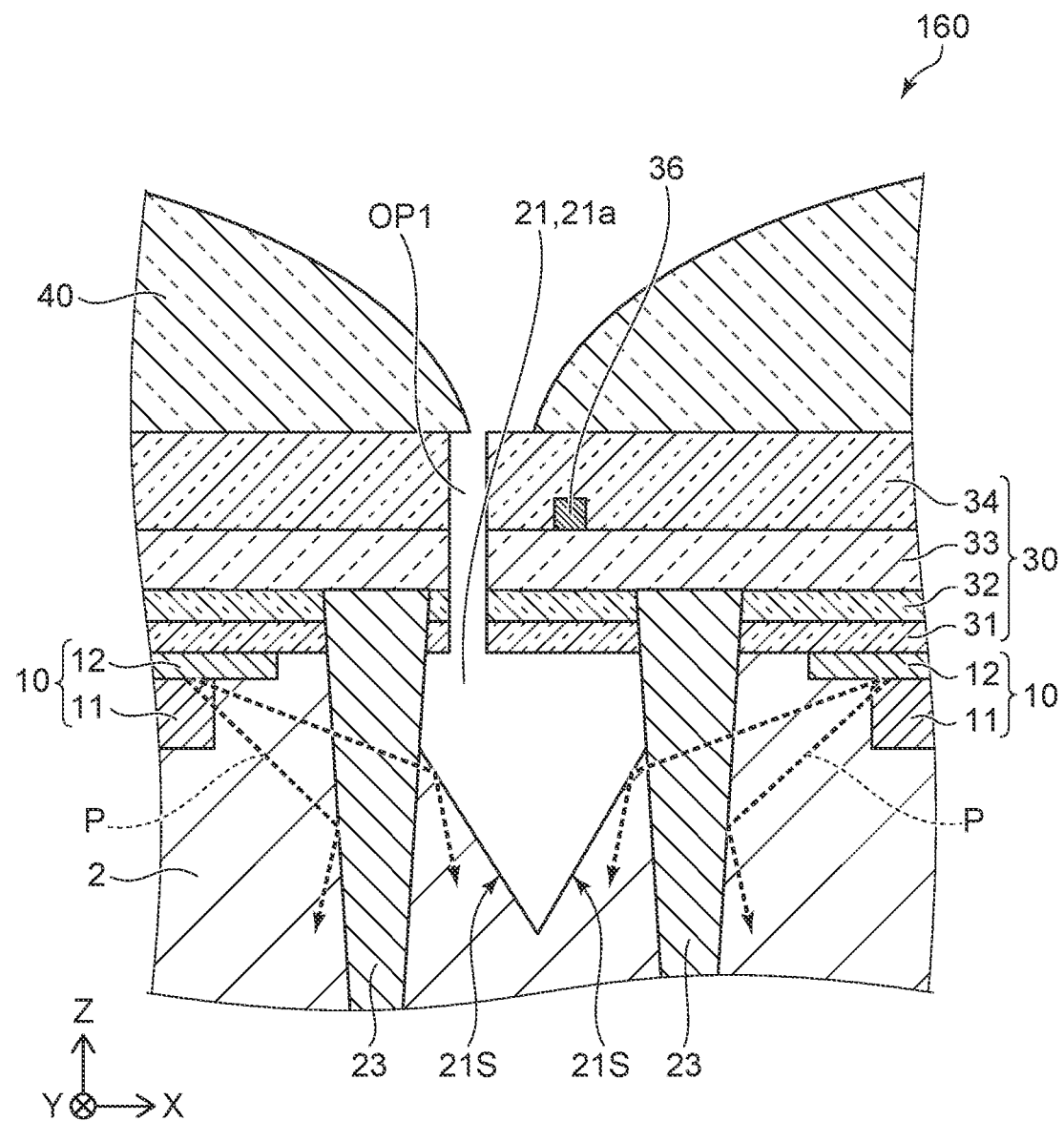
FIG. 29 is an enlarged cross-sectional view of a portion of FIG. 28.

FIG. 29 is an enlarged cross-sectional view of a portion of FIG. 28.

As shown in FIG. 29, a portion of the first insulating portion 21 is provided between the adjacent junction regions 10. The portion of the first insulating portion 21 has a pair of the inclined surfaces 21S facing each other.

Some of the secondary photons P generated in the junction region 10 are reflected by the inclined surface 21S. The secondary photons P traveling below the inclined surface 21S are reflected by the interface between the semiconductor layer 2 and the third insulating portion 23. According to the light detector 160 according to the sixth variation, similarly to the light detector 140, the crosstalk can be suppressed.

[Seventh Variation]

Figure 30:
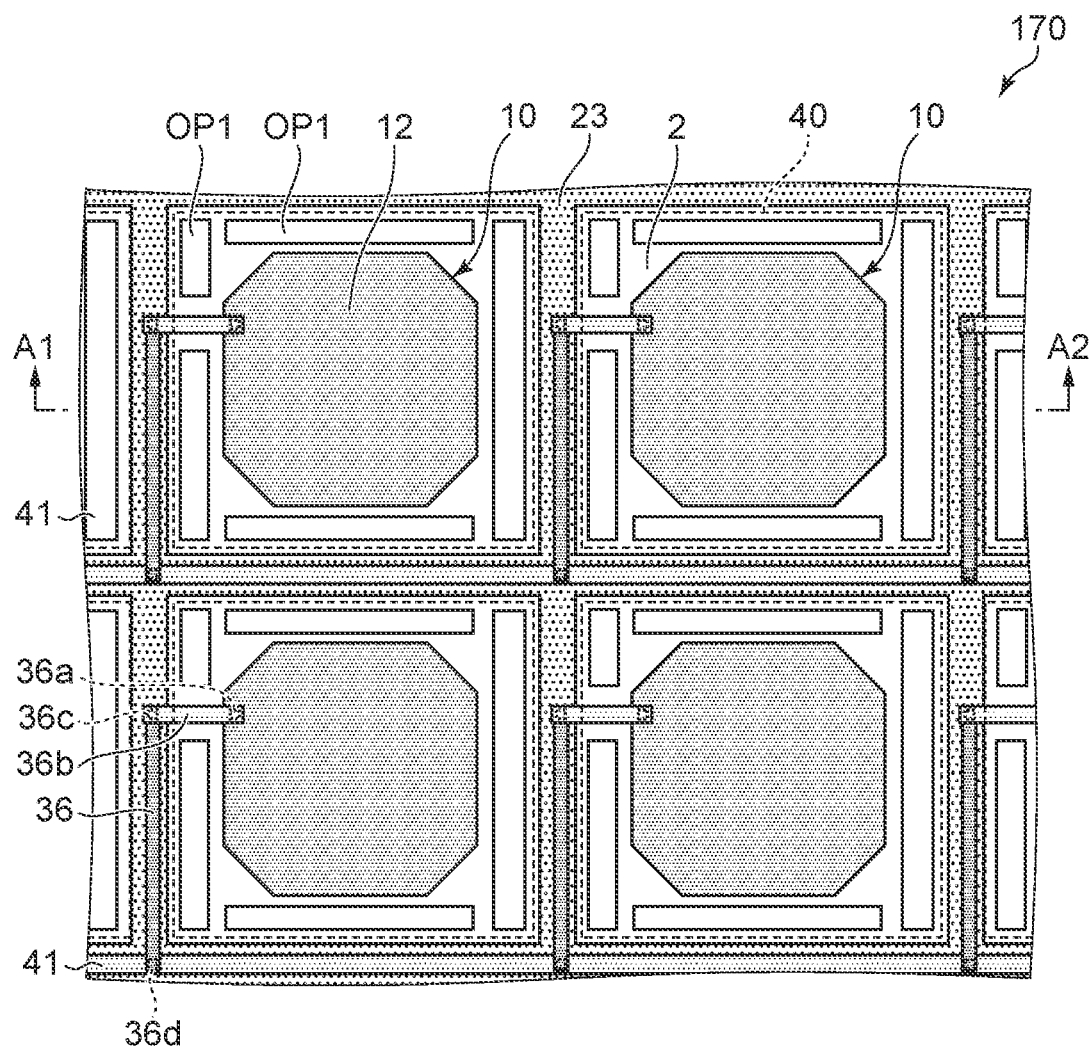
FIG. 30 is a plan view showing a light detector according to a seventh variation of the first embodiment.
Figure 31:
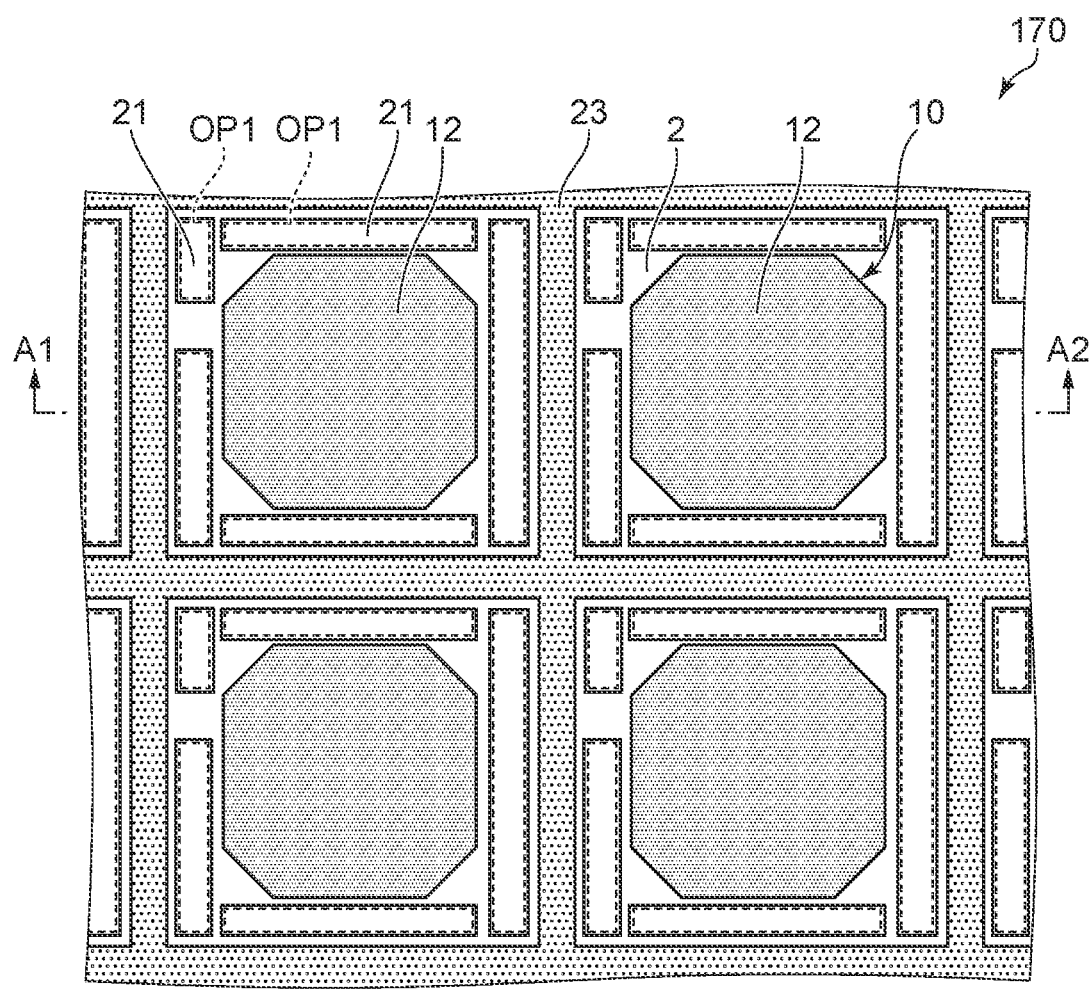
FIG. 31 is a plan view showing the light detector according to the seventh variation of the first embodiment.
Figure 32:
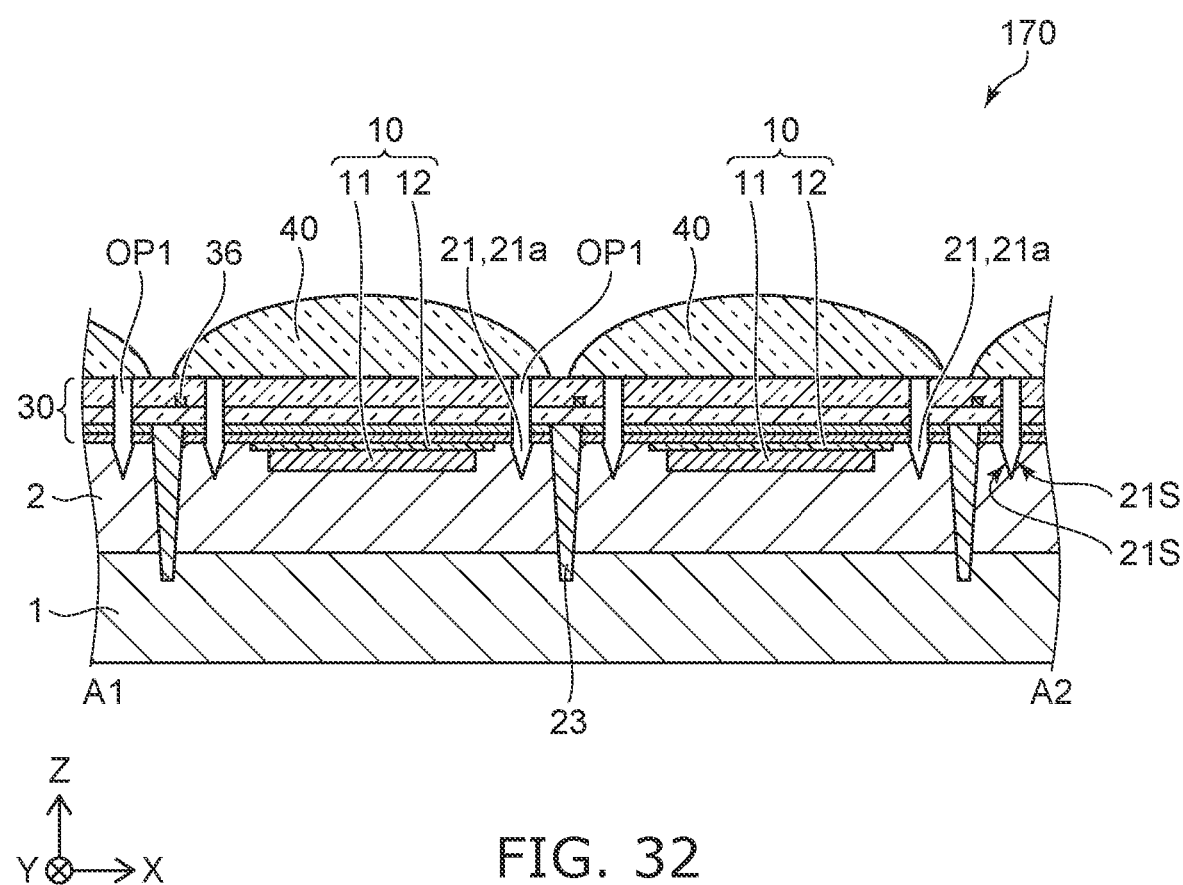
FIG. 32 is a cross-sectional view taken along the line A1-A2 of FIGS. 30 and 31.

FIGS. 30 and 31 are plan views showing a light detector according to a seventh variation of the first embodiment. FIG. 32 is a cross-sectional view taken along the line A1-A2 of FIGS. 30 and 31.

In FIG. 30, the lens 40 is shown by a broken line, and the first insulating portion 21 and the insulating layer 30 are omitted. In FIG. 31, the insulating layer 30, the quenching part 36, the lens 40, and the first interconnect 41 are omitted.

In a light detector 170 according to the seventh variation, as shown in FIG. 30, the first opening OP1 is located between the junction region 10 and the third insulating portion 23 when viewed from the Z-direction. The multiple first openings OP1 are provided around the junction region 10. The multiple first openings OP1 are separated from each other.

As shown in FIGS. 31 and 32, the first insulating portion 21 is provided between the junction region 10 and the third insulating portion 23. The multiple first insulating portions 21 are provided around the junction region 10 along the X-Y plane. The multiple first insulating portions 21 are separated from each other.

According to the light detector 170, similarly to the light detector 140, some of the secondary photons generated in the junction region 10 are reflected by the inclined surface 21S. The secondary photons traveling below the inclined surface 21S are reflected by the interface between the semiconductor layer 2 and the third insulating portion 23. Accordingly, the crosstalk in the light detector 170 can be suppressed.

The structures according to the above-described variations can be appropriately combined. For example, in any of the light detectors 140, 150, 160, and 170, similarly to the light detector 110, the insulator 42 may be provided. In any of the light detectors 140, 150, 160, and 170, similarly to the light detector 120, the insulating region 21b and the insulator 42 may be provided. In any of the light detectors 150, 151, 160, and 170, similarly to light detector 140, the second opening OP2 communicating with the void 21a may be provided.

Second Embodiment

Figure 33:
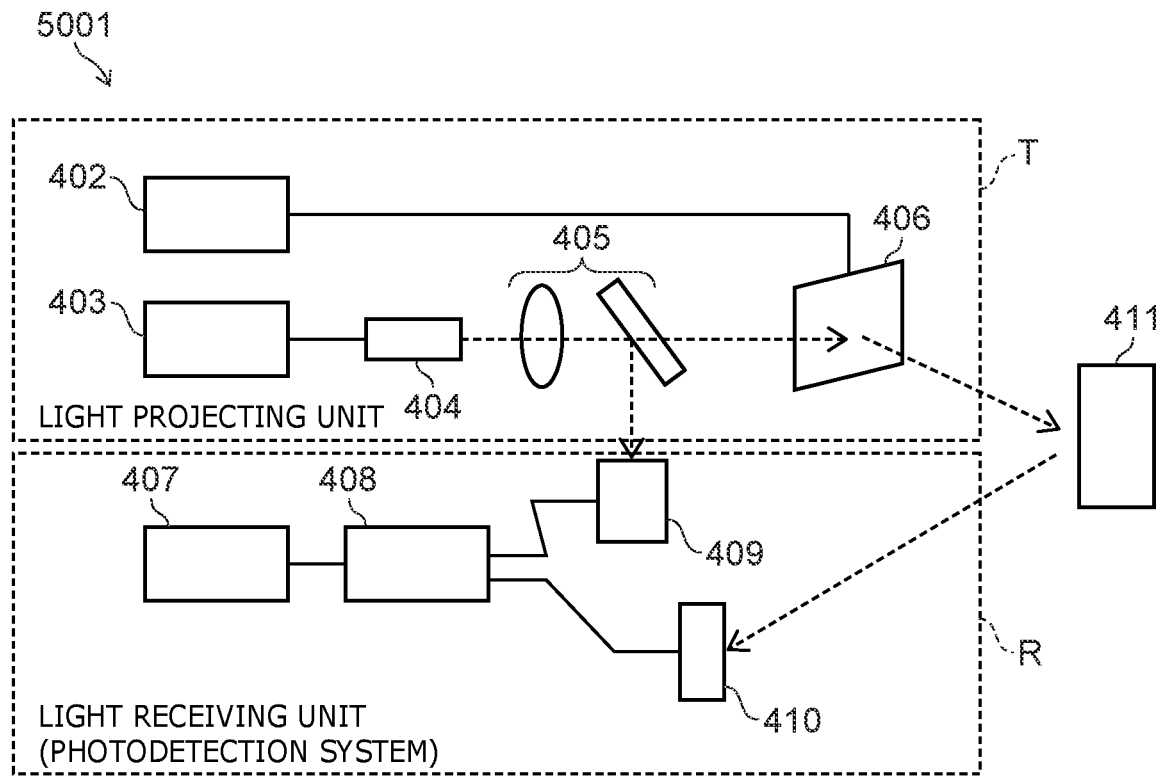
FIG. 33 is a schematic view illustrating a Laser Imaging Detection and Ranging (LIDAR) device according to a second embodiment.

FIG. 33 is a schematic view illustrating a Laser Imaging Detection and Ranging (LIDAR) device according to a second embodiment.

The embodiment is applicable to a long-distance subject detection system (LIDAR) or the like including a line light source and a lens. The lidar device 5001 includes a light projecting unit T projecting laser light toward an object 411, and a light receiving unit R (also called a light detection system) receiving the laser light from the object 411, measuring the time of the round trip of the laser light to and from the object 411, and converting the time into a distance.

In the light projecting unit T, a laser light oscillator (also called a light source) 404 produces laser light. A drive circuit 403 drives the laser light oscillator 404. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light receiving unit R, a reference light detector 409 detects the reference light extracted by the optical system 405. A light detector 410 receives the reflected light from the object 411. A distance measuring circuit 408 measures the distance to the object 411 based on the reference light detected by the reference light detector 409 and the reflected light detected by the light detector 410. An image recognition system 407 recognizes the object 411 based on the measurement results of the distance measuring circuit 408.

The lidar device 5001 employs light time-of-flight ranging (Time of Flight) in which the time of the round trip of the laser light to and from the object 411 is measured and converted into a distance. The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band that is invisible to humans. For example, the lidar device 5001 can be used for obstacle detection in a moving body.

Figure 34:
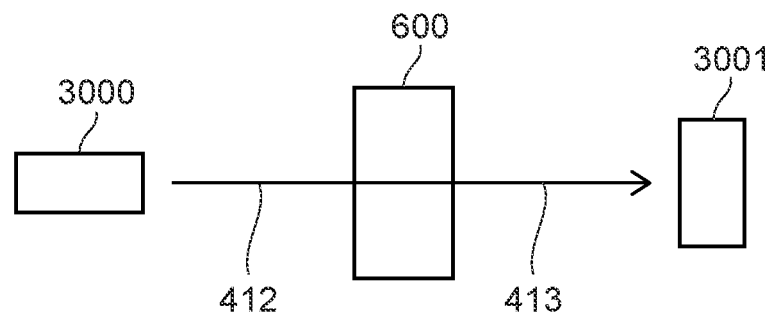
FIG. 34 is a drawing for describing the detection of the detection object of the lidar device.

FIG. 34 is a drawing for describing the detection of the detection object of the lidar device.

A light source 3000 emits light 412 toward an object 600 that is the detection object. A light detector 3001 detects light 413 that passes through the object 600, is reflected by the object 600, or is diffused by the object 600.

For example, the light detector 3001 can realize highly-sensitive detection when the light detector according to the embodiment described above is used. It is favorable to provide multiple sets of the light detector 410 and the light source 404 and to preset the arrangement relationship in the software (which is replaceable with a circuit). For example, it is favorable for the arrangement relationship of the sets of the light detector 410 and the light source 404 to be provided at uniform spacing. Thereby, an accurate three-dimensional image can be generated by the output signals of each light detector 410 complementing each other.

Figure 35:
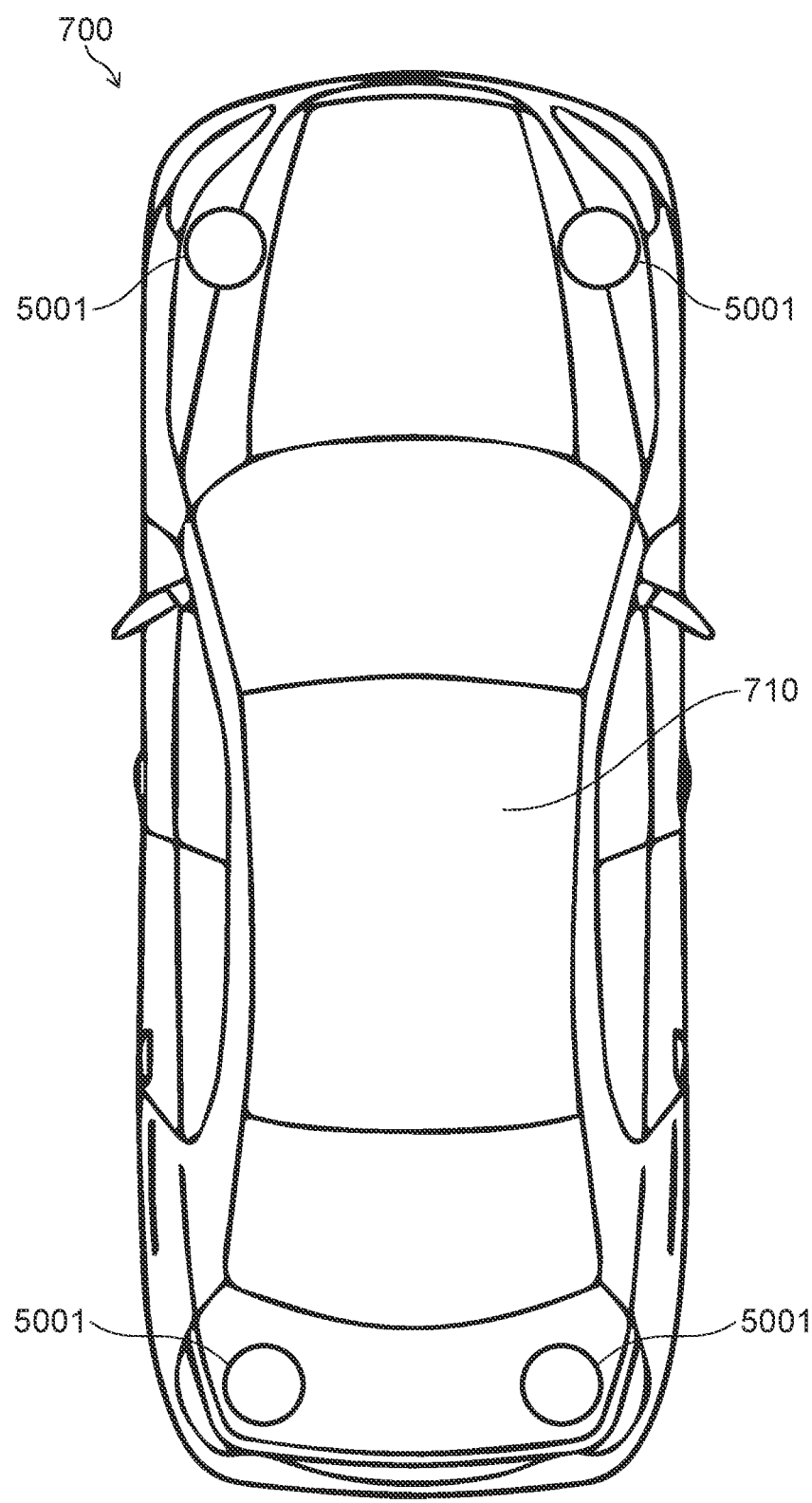
FIG. 35 is a schematic top view of a moving body including the lidar device according to the second embodiment.

FIG. 35 is a schematic top view of a moving body including the lidar device according to the second embodiment.

A moving body according to the embodiment may be a vehicle as illustrated in FIG. 35. The vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar devices.

The moving body may be a drone, a robot, or the like, other than the vehicle shown in FIG. 35. The robot is, for example, an automatic guided vehicle (AGV). By providing the lidar devices at the four corners of these moving bodies, the environment of the moving body in all directions can be detected by the lidar devices.

According to the embodiment described above, it is possible to reduce crosstalk in a light detector.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in light detectors such as semiconductor layers, first semiconductor regions, second semiconductor regions, first insulating portions, second insulating portions, third insulating portions, insulating layers, quenching parts, lenses, first interconnects, insulators, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light detectors, light detection systems, lidar devices, and moving bodies practicable by an appropriate design modification by one skilled in the art based on the light detectors, the light detection systems, the lidar devices, and the moving bodies described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detector comprising:
a junction region including a first semiconductor region of a first conductivity type and a second semiconductor region of a second conductivity type, the second semiconductor region being provided on the first semiconductor region and forming a p-n junction surface with the first semiconductor region;
a first insulating portion having an inclined surface inclined with respect to a first direction perpendicular to the p-n junction surface, a first insulating portion including void, the inclined surface facing the junction region in a second direction perpendicular to the first direction; and
a quenching part electrically connected to the second semiconductor region.

2. The light detector according to claim 1, wherein
a length in the second direction of a portion of the first insulating portion is shorter than a length in the second direction of another portion of the first insulating portion located above the portion of the first insulating portion.

3. The light detector according to claim 1, further comprising:
a second insulating portion provided on the first insulating portion and including an insulating material,
a first opening communicating with the void being provided in the second insulating portion.

4. The light detector according to claim 3, wherein
when viewed from the first direction, a position of the first opening is different from a position of the quenching part.

5. The light detector according to claim 1, wherein
the first insulating portion includes an insulating region provided between the inclined surface and the void, and
the insulating region includes a resin, oxide, or nitride.

6. The light detector according to claim 1, further comprising:
an insulating layer provided on the junction region and the first insulating portion;
a lens provided on the insulating layer and including a resin; and
an insulator surrounded by the insulating layer along a first plane perpendicular to the first direction and including the resin.

7. The light detector according to claim 6, wherein
the first insulating portion includes an insulating region provided between the inclined surface and the void, and
the insulating region includes the resin and is connected with the insulator.

8. The light detector according to claim 1, wherein
an angle of the inclined surface with respect to the first direction is larger than 45 degrees and smaller than 74 degrees.

9. A light detector comprising:
a junction region including a first semiconductor region of a first conductivity type and a second semiconductor region of a second conductivity type, the second semiconductor region being provided on the first semiconductor region;
a first insulating portion having an inclined surface inclined with respect to a first direction from the first semiconductor region toward the second semiconductor region, a refractive index of the first insulating portion being larger than 1.5 and smaller than 2.0, an angle of the inclined surface with respect to the first direction being larger than 45 degrees and smaller than 74 degrees, the inclined surface being provided at a same height as at least a portion of the junction region and crossing the second direction from the junction region toward the first insulating portion; and
a quenching part electrically connected to the second semiconductor region.

10. The light detector according to claim 1, wherein
a plurality of first insulating portions are provided around the junction region on a first surface perpendicular to the first direction, and
the first insulating portions are separated from each other.

11. The light detector according to claim 10, further comprising:
a third insulating portion provided between the junction region and the first insulating portions and including an insulating material,
a length of the third insulating portion in the first direction being longer than a length of the first insulating portion in the first direction.

12. The light detector according to claim 10, further comprising:
a third insulating portion provided around the first insulating portions on the first surface and including an insulating material,
a length of the third insulating portion in the first direction is longer than a length of the first insulating portion in the first direction.

13. The light detector according to claim 1, wherein
the plurality of junction regions are provided in the second direction,
the plurality of first insulating portions are provided in the second direction, and
the junction regions and the first insulating portions are alternately provided in the second direction.

14. The light detector according to claim 1, wherein
a portion of the inclined surface is provided at a same height as an interface between the first semiconductor region and the second semiconductor region.

15. The light detector according to claim 1, wherein
the junction region and the first insulating portion are provided on the semiconductor layer,
the semiconductor layer includes silicon, and
a (100) plane of the silicon is perpendicular to the first direction.

16. The light detector according to claim 1, wherein
the first semiconductor region and the second semiconductor region consist an avalanche photodiode operating in a Geiger mode.

17. A light detection system, comprising:
the light detector according to claim 1; and
a distance measuring circuit calculating a time-of-flight of light from an output signal of the light detector.

18. A lidar device, comprising:
a light source irradiating light onto an object; and
the light detection system according to claim 17 detecting light reflected by the object.

19. The lidar device according to claim 18, further comprising:
an image recognition system generating a three-dimensional image based on an arrangement relationship of the light source and the light detector.

20. A moving body, comprising:
the lidar device according to claim 18.

* * * * *